(12) United States Patent
Hosotani

(10) Patent No.: US 9,043,046 B2
(45) Date of Patent: *May 26, 2015

(54) DATA PROCESSING DEVICE, MICROCONTROLLER, AND SELF-DIAGNOSIS METHOD OF DATA PROCESSING DEVICE

(71) Applicant: Renesas Electronics Corporation, Kawasaki-shi, Kanagawa (JP)

(72) Inventor: Akira Hosotani, Kawasaki (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/174,468

(22) Filed: Feb. 6, 2014

(65) Prior Publication Data

US 2014/0157059 A1    Jun. 5, 2014

Related U.S. Application Data

(63) Continuation of application No. 13/899,102, filed on May 21, 2013, now Pat. No. 8,682,501.

(30) Foreign Application Priority Data

May 31, 2012    (JP) .................................. 2012-123900

(51) Int. Cl.
| | | |
|---|---|---|
| *G06F 17/00* | (2006.01) | |
| *G06F 11/22* | (2006.01) | |
| *G11C 29/38* | (2006.01) | |
| *G06F 11/10* | (2006.01) | |
| *G11C 29/04* | (2006.01) | |

(52) U.S. Cl.
CPC ............ *G06F 11/2273* (2013.01); *G11C 29/38* (2013.01); *G11C 2029/0409* (2013.01); *G06F 11/1048* (2013.01)

(58) Field of Classification Search
CPC .............. G06F 11/006; G06F 11/1008; G06F 11/1044; G06F 11/1604; G06F 11/1633
USPC ............... 701/1, 34.3, 99, 114; 714/704, 724, 714/726; 73/114.61; 702/183; 128/920; 710/19; 360/31; 369/53.42; 327/12, 327/150, 159
See application file for complete search history.

(56) References Cited

U.S. PATENT DOCUMENTS

| | | | | |
|---|---|---|---|---|
| 4,769,804 | A * | 9/1988 | Satoh et al. ................. | 369/53.16 |
| 5,588,112 | A * | 12/1996 | Dearth et al. ................ | 714/5.11 |
| 5,920,714 | A * | 7/1999 | Schiffleger .................... | 712/241 |
| 6,594,781 | B1 * | 7/2003 | Komasaka et al. ............. | 714/19 |

(Continued)

FOREIGN PATENT DOCUMENTS

| | | |
|---|---|---|
| JP | 6-324950 | 11/1994 |
| JP | 2009-282849 A | 12/2009 |
| JP | 2009-289170 A | 12/2009 |

*Primary Examiner* — McDieunel Marc
(74) *Attorney, Agent, or Firm* — Foley & Lardner LLP

(57) ABSTRACT

A data processing device includes a memory, an arithmetic circuit that accesses the memory by outputting an access control signal CTRL that controls access to the memory, a first data storage unit that stores first data used when a self-diagnosis is performed, a read-modify-write circuit that generates second data by replacing a part of the first data stored in the first data storage unit with modify data outputted from the arithmetic circuit, and a determination unit that diagnoses a failure of the read-modify-write circuit by comparing the second data with an expected value.

20 Claims, 24 Drawing Sheets

(56) References Cited

U.S. PATENT DOCUMENTS

| | | | |
|---|---|---|---|
| 7,417,894 B2* | 8/2008 | Vali et al. | 365/185.17 |
| 7,577,558 B2* | 8/2009 | Birguer | 703/23 |
| 8,234,463 B2 | 7/2012 | Ikeuchi et al. | |
| 8,458,423 B2* | 6/2013 | Hamaguchi | 711/163 |
| 8,682,501 B2* | 3/2014 | Hosotani | 701/1 |
| 2006/0230251 A1* | 10/2006 | Birguer | 711/202 |
| 2007/0189071 A1* | 8/2007 | Vali et al. | 365/185.08 |
| 2009/0271540 A1* | 10/2009 | Hirayama | 710/38 |
| 2011/0320748 A1* | 12/2011 | Hamaguchi | 711/154 |
| 2013/0325206 A1* | 12/2013 | Hosotani | 701/1 |

* cited by examiner

FIG. 3

| ACCESS CONTROL SIGNAL CTRL | PROCESS OF ACCESS CONTROL CIRCUIT |
|---|---|
| 000 | READ READ DATA FROM MEMORY |
| 001 | WRITE WRITE DATA TO MEMORY |
| 010 | RMW PROCESS |
| 100 | READ SELF-DIAGNOSIS OUTPUT DATA |
| 101 | WRITE SELF-DIAGNOSIS DATA |
| 110 | PERFORM SELF-DIAGNOSIS OF RMW CIRCUIT |

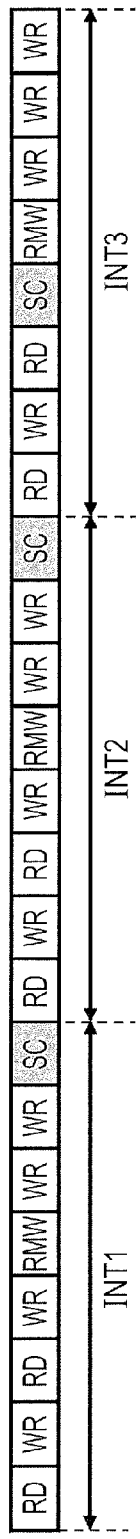
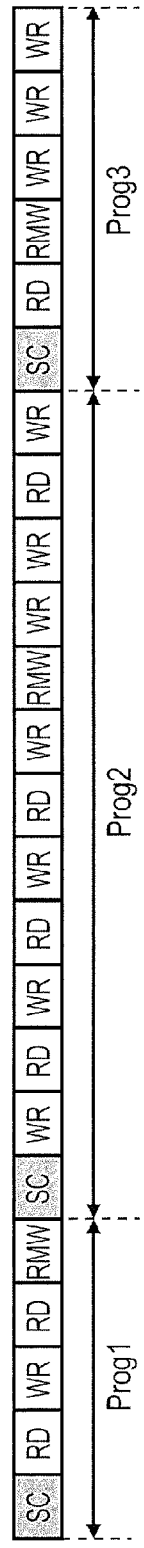

FIG. 19

| EXTENDED CONTROL SIGNAL CTRL_EX | PROCESS OF ACCESS CONTROL CIRCUIT | RAM TO BE ACCESSED |
|---|---|---|
| 000 | READ READ DATA FROM MEMORY | RAM_1 |
| 001 | WRITE WRITE DATA TO MEMORY | RAM_1 |
| 010 | RMW PROCESS | RAM_1 |
| 011 | PERFORM SELF-DIAGNOSIS OF RMW CIRCUIT | RAM_1 |
| 100 | READ READ DATA FROM MEMORY | RAM_2 |
| 101 | WRITE WRITE DATA TO MEMORY | RAM_2 |
| 110 | RMW PROCESS | RAM_2 |
| 111 | PERFORM SELF-DIAGNOSIS OF RMW CIRCUIT | RAM_2 |

DATA PROCESSING DEVICE, MICROCONTROLLER, AND SELF-DIAGNOSIS METHOD OF DATA PROCESSING DEVICE

CROSS-REFERENCE TO RELATED APPLICATIONS

This application is a continuation of U.S. application Ser. No. 13/899,102, filed May 21, 2013, which claims priority to Japanese Patent Application No. 2012-123900, filed May 31, 2012. The disclosures of both prior applications, including the specification, drawings and abstract, are incorporated herein by reference in their entirety.

BACKGROUND

The present invention relates to a data processing device, a microcontroller, and a self-diagnosis method of the data processing device, in particular to a data processing device, a microcontroller, and a self-diagnosis method of the data processing device which can perform a read-modify-write process.

In a data processing device including an arithmetic circuit (for example, CPU: Central Processing Unit) and a memory, the arithmetic circuit accesses the memory, so that the data processing device can perform various processes. There are data processing devices which include a read-modify-write circuit that performs a read-modify-write process. Here, the read-modify-write process is a process where data read from the memory is modified and the modified data is written back to the memory. It is possible to reduce the latency of the data processing device by disposing the read-modify-write circuit realizing such a process near the memory.

Nowadays, such a data processing device is used in various apparatuses and a high reliability of the data processing device is required. For example, when the data processing device is used as an in-car microcomputer, a high self-diagnosis rate is required in an international functional safety standard. Therefore, to improve the reliability of the data processing device, for example, the data processing device is required to have a duplex structure.

Japanese Unexamined Patent Application Publication No. 2009-282849 discloses a technique related to a microcomputer including duplicated CPUs and duplicated ECC (Error Checking and Correction) circuits. The technique disclosed in Japanese Unexamined Patent Application Publication No. 2009-282849 can determine which ECC circuit of the duplicated ECC circuits fails, so that the reliability of the microcomputer is improved.

Japanese Unexamined Patent Application Publication No. 2009-289170 discloses a technique related to a data processing device which can increase the speed of the read-modify-write process. Japanese Unexamined Patent Application Publication No. Hei6 (1994)-324950 discloses a technique related to a memory control circuit which can correct an error even if a part of a memory fails in a case in which the memory outputs a plurality of data bits.

SUMMARY

As described in BACKGROUND, nowadays, high reliability is required for data processing devices, so that high reliability is also required for data processing devices including the read-modify-write circuit. Therefore, for example, it is possible to improve the reliability of a data processing device by providing a self-diagnosis function to the read-modify-write circuit.

However, even when the self-diagnosis function is provided to the read-modify-write circuit, if there is a plurality of masters that access the memory, there is a risk that the read-modify-write circuit may be affected by accesses from other masters. In other words, there is a risk that a self-diagnosis result is altered by an access of another master, so that there is a problem that the reliability of the read-modify-write circuit degrades.

A data processing device according to one aspect of the present invention includes a memory, an arithmetic circuit that accesses the memory, a first data storage unit, a read-modify-write circuit, and a determination unit. When the self-diagnosis is performed, the read-modify-write circuit generates second data by replacing a part of first data stored in the first data storage unit with modify data outputted from the arithmetic circuit. The determination unit diagnoses a failure of the read-modify-write circuit by comparing the generated second data with an expected value. By using such a configuration, it is possible to prevent the accesses from the other masters from affecting the self-diagnosis result, so that it is possible to improve the reliability of the self-diagnosis of the read-modify-write circuit.

At this time, the first data storage unit may store data outputted from the arithmetic circuit as the first data used when the self-diagnosis is performed. The data processing device may further include a second data storage unit that stores the generated second data.

The first and the second data storage units may be provided in a self-diagnosis data area in the memory.

The memory may include a first memory and a second memory. The read-modify-write circuit may include a first read-modify-write circuit provided corresponding to the first memory and a second read-modify-write circuit provided corresponding to the second memory. In this case, the data processing device further includes a monitor circuit and a self-diagnosis control circuit that controls the self-diagnosis of the first and the second read-modify-write circuits according to a monitoring result of the monitor circuit. When the self-diagnosis is performed, the self-diagnosis control circuit performs the self-diagnosis on a read-modify-write circuit corresponding to a memory on which the read-modify-write process is performed. At this time, the monitor circuit may generate an extended control signal according to an access control signal and an address signal which are outputted from the arithmetic circuit.

The data processing device according to another aspect of the present invention can be applied to a microcontroller and an in-care microcontroller.

When the self-diagnosis is performed, a failure diagnosis method of the data processing device according to another aspect of the present invention diagnoses a failure of the read-modify-write circuit by generating second data by replacing a part of first data used for self-diagnosis with modify data outputted from an arithmetic circuit and comparing the generated second data with an expected value.

According to the aspects of the present invention, there can be provided a data processing device, a microcontroller, and a self-diagnosis method of the data processing device which can improve the reliability of the self-diagnosis of the read-modify-write circuit.

BRIEF DESCRIPTION OF THE DRAWINGS

FIG. 3 is a table showing a relationship between an access control signal CTRL and a process of an access control circuit;

FIG. 10A is a diagram for explaining timing of the self-diagnosis in the data processing device according to the first embodiment (at predetermined intervals);

FIG. 10B is a diagram for explaining timing of the self-diagnosis in the data processing device according to the first embodiment (for each program execution);

FIG. 10C is a diagram for explaining timing of the self-diagnosis in the data processing device according to the first embodiment (for each RMW process execution);

FIG. 19 is a table showing a relationship between an extended control signal CTRL_EX and a process of an access control circuit;

DETAILED DESCRIPTION

Prior to describing details of embodiments of the present invention, an outline of a microcontroller to which a data processing device according to the present invention is applied will be described. Although the present invention is applied to the microcontroller described below, the microcontroller described below is an example and the present invention may be applied to other microcontrollers.

Figure 1:
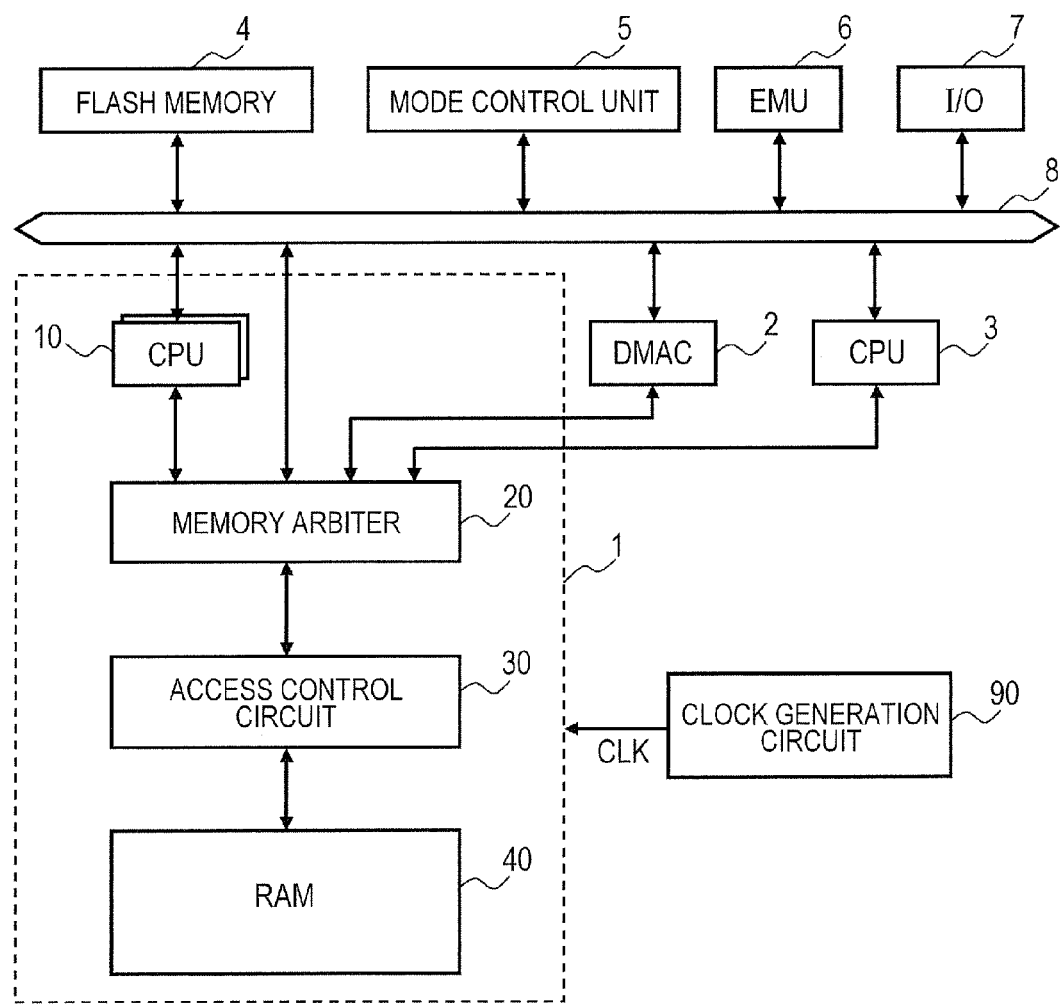
FIG. 1 is a schematic diagram of a microcontroller to which a data processing device according to the present invention is applied.

FIG. 1 shows a schematic diagram of the microcontroller to which the data processing device according to the present invention is applied. As shown in FIG. 1, the microcontroller to which the present invention is applied includes a data processing device 1, a DMAC (Direct Memory Access Controller) 2, a CPU 3, a flash memory 4, a mode control unit 5, an EMU (Error Management Unit) 6, an I/O (Input/Output) 7, and a system bus 8. Here, the data processing device 1 includes a CPU 10, a memory arbiter 20, an access control circuit 30, and a memory (RAM) 40.

The data processing device 1, the DMAC 2, the CPU 3, the flash memory 4, the mode control unit 5, the EMU 6, and the I/O (Input/Output) 7 are coupled to the system bus 8 to be able to transmit and receive data to and from each other through the system bus 8. The system bus 8 includes an address bus, a data bus, and a control bus. Therefore, the CPU 10, which is coupled to the system bus 8, is coupled to the address bus, the data bus, and the control bus.

The CPU 10 can execute a program stored in, for example, the flash memory 4. At this time, the CPU 10 may use the memory 40 as a data memory. Since the CPU 10 has a duplex configuration, it is possible to improve hardware reliability of the CPU 10. Although the CPU 10 has the duplex configuration, the CPU 10 can operate as a single processor for software. The memory arbiter 20 arbitrates accesses from the CPU 10, the system bus 8, the DMAC 2, and the CPU 3 to the memory 40.

The access control circuit 30 is a circuit that controls accesses from the CPU 10, the system bus 8, the DMAC 2, and the CPU 3 to the memory 40. The access control circuit 30 also includes a read-modify-write circuit (not shown in the drawings). The read-modify-write circuit can perform a process to modify data read from the memory 40 by using modify data outputted from the CPU 10 and write the modified data back into the memory. In this way, the read-modify-write circuit is disposed in the access control circuit 30 disposed near the memory 40, so that it is possible to reduce the latency of the microcontroller.

The memory 40 temporarily stores, for example, a program read from the outside and data processed by the CPU 10. The DMAC 2 performs data transfer to and from the memory 40 not through the CPU 10. The CPU 3 is a processor that can executes a predetermined program. The flash memory 4 stores, for example, a program executed by the CPU 10. The mode control unit 5 is a circuit that sets a diagnostic mode of self-diagnosis of the read-modify-write circuit performed by the CPU 10. The EMU 6 is a circuit that manages an error detected in a self-diagnosis process of the read-modify-write circuit. The I/O 7 is an interface for inputting data from an external device and outputting data to an external device.

Next, details of the data processing device according to the present invention will be described.

First Embodiment

Figure 2:
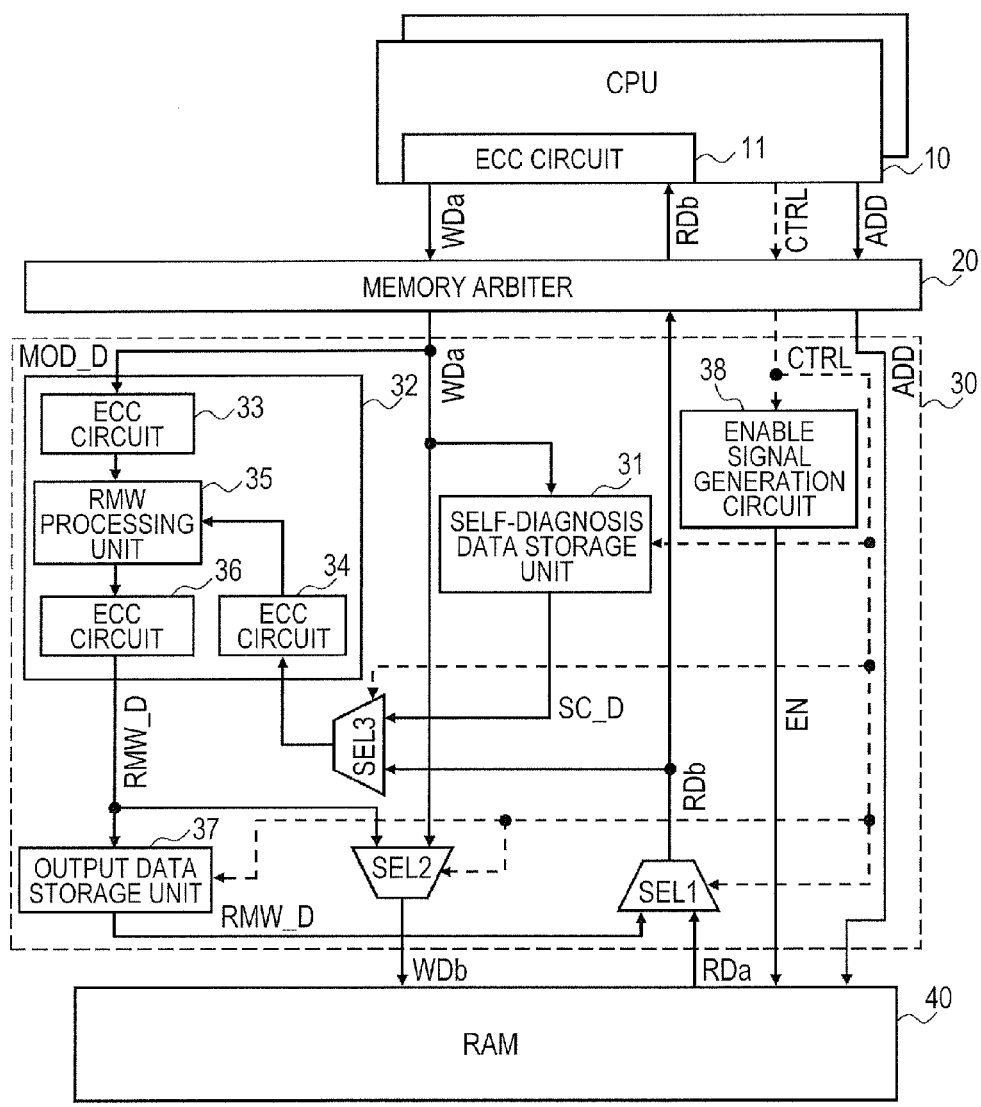
FIG. 2 is a block diagram showing a data processing device according to a first embodiment.

FIG. 2 is a block diagram showing a data processing device according to a first embodiment of the present invention. As shown in FIG. 2, the data processing device according to the present embodiment includes the CPU (arithmetic circuit) 10, the memory arbiter 20, the access control circuit 30, and the memory 40. The CPU 10, the memory arbiter 20, the access control circuit 30, and the memory 40 included in the data processing device are provided with a common clock signal CLK from a clock generation circuit 90. Each circuit element shown in FIG. 1 is also provided with a clock signal from the clock generation circuit 90.

The CPU 10 executes a predetermined program. The program executed by the CPU 10 is stored, for example, in the flash memory 4 shown in FIG. 1. In this case, the CPU 10 reads the program from the flash memory 4 and performs various processes according to the read program. The CPU 10 accesses the memory 40 according to the executed program. When the CPU 10 accesses the memory 40, the CPU 10 outputs an access control signal CTRL that controls the access to the memory 40. The access control signal CTRL is a signal to control the access control circuit 30. When the CPU 10 accesses the memory 40, the CPU 10 outputs an address signal ADD and write data WDa, and read data RDb is inputted into the CPU 10 from the access control circuit 30. Here, the access control signal CTRL, the address signal ADD, and the write data WDa outputted from the CPU 10 are outputted to the access control circuit 30 through the memory arbiter 20. The read data RDb outputted from the access control circuit 30 is supplied to the CPU 10 through the memory arbiter 20.

The CPU 10 includes an ECC circuit 11. The ECC circuit 11 includes an ECC encoder and an ECC decoder. The ECC encoder generates an error correcting code ECC for the write data WDa and adds the generated error correcting code ECC to the write data WDa. The ECC decoder detects an error of the read data RDb and corrects the read data RDb by using an error correcting code ECC included in the read data RDb.

When there is a plurality of masters that access the memory 40, that is, when there are masters other than the CPU 10 (for example, DMAC 2 and CPU 3 shown in FIG. 1) that access the memory 40, the memory arbiter 20 arbitrates access requests from each master to the memory 40 and access requests from the memory 40 (access control circuit 30) to each master. If it is unnecessary to arbitrate the accesses to the memory 40 (for example, if there is no master other than the CPU 10 which accesses the memory 40), the memory arbiter 20 can be omitted.

The memory 40 stores write data WDb outputted from the access control circuit 30 and outputs read data RDa to the access control circuit 30. At this time, the memory 40 stores an error correcting code ECC added to the write data WDb in association with the write data WDb. When the memory 40 receives a read instruction from the CPU 10, the memory 40 outputs the read data RDa and an error correcting code ECC associated with the read data RDa.

The access control signal CTRL, the address signal ADD, and the write data WDa outputted from the CPU 10 through the memory arbiter 20 are inputted into the access control circuit 30 and the access control circuit 30 outputs the read data RDb to the CPU 10 through the memory arbiter 20. The access control circuit 30 writes the write data WDb to the memory 40 and reads the read data RDa from the memory 40.

In summary, the access control circuit 30 controls transmission and reception of data performed between the CPU 10 and the memory 40 on the basis of the access control signal CTRL outputted from the CPU 10 through the memory arbiter 20.

FIG. 3 is a table showing a relationship between the access control signal CTRL and the process of the access control circuit 30. As shown in FIG. 3, when the access control signal CTRL (3-bit signal) is "000", the access control circuit 30 performs a process to read the read data RDa from the memory 40. When the access control signal CTRL is "001", the access control circuit 30 performs a process to write the write data WDa outputted from the CPU 10 to the memory 40. When the access control signal CTRL is "010", the access control circuit 30 performs a read-modify-write process (hereinafter also referred to as "RMW process"). When the access control signal CTRL is "100", the access control circuit 30 performs a process to output self-diagnosis output data to the CPU 10. When the access control signal CTRL is "101", the access control circuit 30 performs a process to write self-diagnosis data outputted from the CPU 10. When the access control signal CTRL is "110", the access control circuit 30 performs self-diagnosis of a read-modify-write circuit 32 (hereinafter also referred to as "RMW circuit").

The access control circuit 30 includes a self-diagnosis data storage unit (first data storage unit) 31, the RMW circuit 32, an output data storage unit (second data storage unit) 37, an enable signal generation circuit 38, and selectors SEL1 to SEL3.

The self-diagnosis data storage unit 31 stores self-diagnosis data (first data) used when the self-diagnosis is performed. When the access control signal CTRL is "101", the self-diagnosis data storage unit 31 stores the write data WDa outputted from the CPU 10 as self-diagnosis data SC_D. The self-diagnosis data storage unit 31 also outputs the self-diagnosis data SC_D to the selector SEL3.

Figure 4:
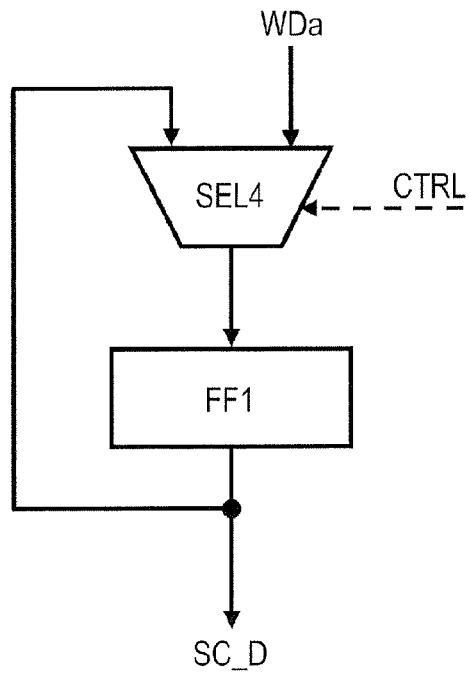
FIG. 4 is a diagram showing an example of a self-diagnosis data storage unit included in the data processing device according to the first embodiment.

FIG. 4 is a diagram showing an example of the self-diagnosis data storage unit 31. As shown in FIG. 4, the self-diagnosis data storage unit 31 includes a selector SEL4 and a flip-flop FF1. The selector SEL4 selects the self-diagnosis data SC_D outputted from the flip-flop FF1 or the write data WDa according to the access control signal CTRL and outputs the selected one to the flip-flop FF1. Specifically, when the access control signal CTRL is "101", the selector SEL4 selects the write data WDa outputted from the CPU 10 and outputs the write data WDa to the flip-flop FF1. The flip-flop FF1 stores the write data WDa as the self-diagnosis data SC_D according to the clock signal CLK. Also, the flip-flop FF1 outputs the self-diagnosis data SC_D according to the clock signal CLK.

Specifically, when the access control signal CTRL is "101", the selector SEL4 selects the write data WDa outputted from the CPU 10, so that the write data WDa is written to the flip-flop FF1 as the self-diagnosis data SC_D (self-diagnosis data is updated). On the other hand, when the access control signal CTRL is other than "101", the selector SEL4 selects the self-diagnosis data SC_D outputted from the flip-flop FF1, so that the self-diagnosis data SC_D is outputted from the flip-flop FF1 according to the clock signal CLK.

The RMW circuit 32 is a circuit to perform the read-modify-write process. The RMW circuit 32 includes ECC circuits 33, 34, and 36 and an RMW processing unit 35. The ECC circuits 33 and 34 are ECC decoders. The ECC circuit 33 detects and corrects an error of modify data MOD_D by using an error correcting code ECC included in the modify data MOD_D outputted from the CPU 10. The ECC circuit 34 detects and corrects an error of the self-diagnosis data SC_D or the read data RDb outputted from the selector SEL3 by using an error correcting code ECC included in these data (SC_D or RDb).

The RMW processing unit 35 modifies a part of the self-diagnosis data SC_D or the read data RDb, which are selected by the selector SEL3 and processed by the ECC circuit 34, on the basis of the modify data MOD_D processed by the ECC circuit 33 and outputs the modified data (output data) RMW_D to the ECC circuit 36. The ECC circuit 36 is an ECC encoder, which generates an error correcting code ECC for the output data RMW_D after the RMW process and adds the generated error correcting code ECC to the output data RMW_D. The output data RMW_D processed by the ECC circuit 36 is outputted to the output data storage unit 37 and the selector SEL2.

When the access control signal CTRL indicates a normal read-modify-write process (access control signal CTRL="010"), the RMW circuit 32 performs the read-modify-write process by replacing a part of the read data RDa read from the memory 40 with the modify data MOD_D. Here, the read data RDa read from the memory 40 is selected by the selector SEL1 and the selector SEL3 and supplied to the RMW circuit 32. In FIG. 2, the read data RDa after being selected by the selector SEL1 is referred to as the read data RDb.

When the access control signal CTRL indicates a self-diagnosis command of the RMW circuit 32 (access control signal CTRL="110"), the RMW circuit 32 performs the read-modify-write process by replacing a part of the self-diagnosis data SC_D outputted from the self-diagnosis data storage unit 31 with the modify data MOD_D.

The output data storage unit 37 stores output data (second data) RMW_D outputted from the RMW circuit 32. In summary, when the access control signal CTRL indicates the self-diagnosis command of the RMW circuit 32 (access control signal CTRL="110"), the output data storage unit 37 stores the output data RMW_D outputted from the RMW circuit 32. Also, the output data storage unit 37 outputs the output data RMW_D to the selector SEL1.

Figure 5:
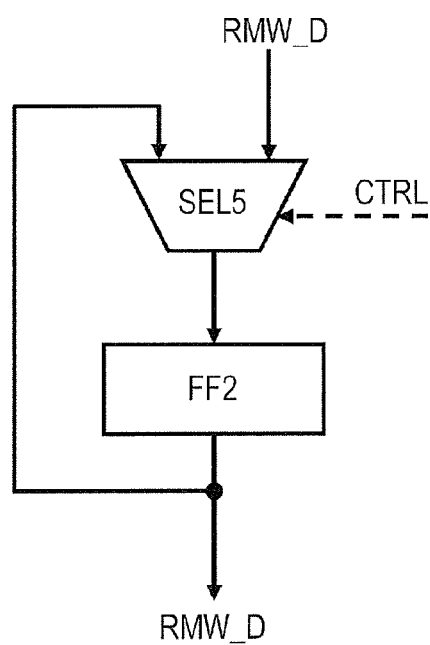
FIG. 5 is a diagram showing an example of an output data storage unit included in the data processing device according to the first embodiment.

FIG. 5 is a diagram showing an example of the output data storage unit 37. As shown in FIG. 5, the output data storage unit 37 includes a selector SEL5 and a flip-flop FF2. The selector SEL5 selects the output data RMW_D outputted from the flip-flop FF2 or the output data RMW_D outputted from the RMW circuit 32 according to the access control signal CTRL and outputs the selected one to the flip-flop FF2. Specifically, when the access control signal CTRL is "110", the selector SEL5 selects the output data RMW_D outputted from the RMW circuit 32 and outputs the output data RMW_D to the flip-flop FF2. The flip-flop FF2 stores the output data RMW_D according to the clock signal CLK. Also, the flip-flop FF2 outputs the output data RMW_D according to the clock signal CLK.

Specifically, when the access control signal CTRL is "110", the selector SEL5 selects the output data RMW_D outputted from the RMW circuit 32, so that the output data RMW_D stored in the flip-flop FF2 is updated. On the other hand, when the access control signal CTRL is other than "110", the selector SEL5 selects the output data RMW_D outputted from the flip-flop FF2, so that the output data RMW_D is outputted from the flip-flop FF2 according to the clock signal CLK.

When the access control signal CTRL is a signal indicating the self-diagnosis command, the enable signal generation circuit 38 outputs a signal indicating an inactive state (for example, a low level signal "0") to the memory 40 as an enable signal EN. Here, the access control signals CTRL that indicate the self-diagnosis command are the access control signal CTRL "100" that commands to output the output data RMW_D for self-diagnosis, the access control signal CTRL "101" that commands to write the self-diagnosis data, and the access control signal CTRL "110" that commands to execute the self-diagnosis of the RMW circuit 32. In other words, the access control signals CTRL that indicate the self-diagnosis command are the access control signals CTRL whose most significant bit is "1". When the CPU 10 accesses the memory 40, the CPU 10 outputs the address signal ADD to the memory 40 through the memory arbiter 20. However, if the enable signal EN of low level is supplied to the memory 40, the memory 40 invalidates the supplied address signal ADD. In this way, when the self-diagnosis is performed, if the enable signal generation circuit 38 outputs the enable signal EN of low level, it is possible to invalidate the access from the CPU 10 to the memory 40 during the self-diagnosis. On the other hand, when the access control signal CTRL indicates reading of read data "000", writing of write data "001", or execution of RMW process "010", the enable signal generation circuit 38 outputs a signal indicating an active state (for example, a high level signal "1") to the memory 40 as the enable signal EN. In this case, the enable signal EN is high level, so that the address signal ADD supplied to the memory 40 is recognized as valid.

The selector SEL1 selects either one of the output data RMW_D outputted from the output data storage unit 37 and the read data RDa read from the memory 40 according to the access control signal CTRL and outputs the selected data as the read data RDb.

The selector SEL2 selects either one of the output data RMW_D outputted from the RMW circuit 32 and the write data WDa outputted from the CPU 10 according to the access control signal CTRL and outputs the selected data as the write data WDb.

The selector SEL3 selects either one of the self-diagnosis data SC_D outputted from the self-diagnosis data storage unit 31 and the read data RDb outputted from the selector SEL1 according to the access control signal CTRL and outputs the selected data to the RMW circuit 32.

The CPU 10 of the data processing device according to the present embodiment includes a determination unit. When the access control signal CTRL is a signal indicating the self-diagnosis command, the determination unit diagnoses a failure of the RMW circuit 32 by comparing the output data RMW_D generated by the RMW circuit 32 with an expected value.

The output data RMW_D stored in the output data storage unit 37 is outputted to the CPU 10 as the read data RDb through the selector SEL1. The ECC decoder of the ECC circuit 11 included in the CPU 10 detects and corrects an error of the output data RMW_D by using an error correcting code ECC included in the output data RMW_D. The output data RMW_D processed by the ECC circuit 11 is outputted to the determination unit included in the CPU 10. When the output data RMW_D corresponds to an expected value, the determination unit included in the CPU 10 can determine that the RMW circuit 32 is normal. On the other hand, when the output data RMW_D does not correspond to the expected value, the determination unit included in the CPU 10 can determine that the RMW circuit 32 fails.

Here, the self-diagnosis data SC_D and the modify data MOD_D which are used in the RMW process in the RMW circuit 32 are data outputted from the CPU 10. Therefore, the CPU 10 can obtain the expected value of the output data RMW_D on the basis of known self-diagnosis data SC_D and modify data MOD_D.

Next, an operation of the data processing device according to the present embodiment will be described. First, a normal operation will be described. When the CPU 10 reads read data from the memory 40, the CPU 10 outputs the access control signal CTRL "000". Also, the CPU 10 outputs an address ADD_rd of the read data as the address signal ADD. At this time, the enable signal generation circuit 38 outputs the enable signal EN of high level to the memory 40. Since the enable signal EN is high level, the memory 40 outputs the read data RDa (including an error correcting code ECC) according to the address ADD_rd to the selector SEL1. Since the access control signal CTRL is "000", the selector SEL1 selects the read data RDa and outputs the read data RDa to the memory arbiter 20 as the read data RDb. Here, the read data RDb is data selected by the selector SEL1. In this case, the read data RDb is the same as the read data RDa. The memory arbiter 20 outputs the read data RDb to the CPU 10.

When the CPU 10 writes write data to the memory 40, the CPU 10 outputs the access control signal CTRL "001" and the write data WDa (including an error correcting code ECC). Also, the CPU 10 outputs an address ADD_wr of the write destination of the write data as the address signal ADD. At this time, the enable signal generation circuit 38 outputs the enable signal EN of high level to the memory 40. Since the access control signal CTRL is "001", the selector SEL2 selects the write data WDa and outputs the write data WDa to the memory 40 as the write data WDb. Here, the write data WDb is data selected by the selector SEL2. In this case, the write data WDb is the same as the write data WDa. Since the enable signal EN is high level, in the memory 40, the write data WDb (including an error correcting code ECC) is written to an address corresponding to the address ADD_wr.

When the CPU 10 performs the RMW process, the CPU 10 outputs the access control signal CTRL "010". Also, the CPU 10 outputs the modify data MOD_D (including an error correcting code ECC) as the write data WDa and outputs an address ADD_rmw, at which data to be processed in the RMW process is stored, as the address signal ADD. At this time, the enable signal generation circuit 38 outputs the enable signal EN of high level to the memory 40. Since the enable signal EN is high level, the memory 40 outputs the read data RDa (including an error correcting code ECC) according to the address ADD_rmw to the selector SEL1. Since the access control signal CTRL is "010", the selector SEL1 selects the read data RDa and outputs the read data RDa to the selector SEL3 as the read data RDb. Since the access control signal CTRL is "010", the selector SEL3 selects the read data RDb and outputs the read data RDb to the RMW circuit 32. The RMW circuit 32 modifies a part of the read data RDb on the basis of the modify data MOD_D and outputs the modified data (output data) RMW_D. Since the access control signal CTRL is "010", the selector SEL2 selects the output data RMW_D of the RMW circuit 32 and outputs the selected output data RMW_D to the memory 40. Since the enable signal EN is high level, in the memory 40, the output data RMW_D (including an error correcting code ECC) is written to an address corresponding to the address ADD_rmw.

Figure 6:
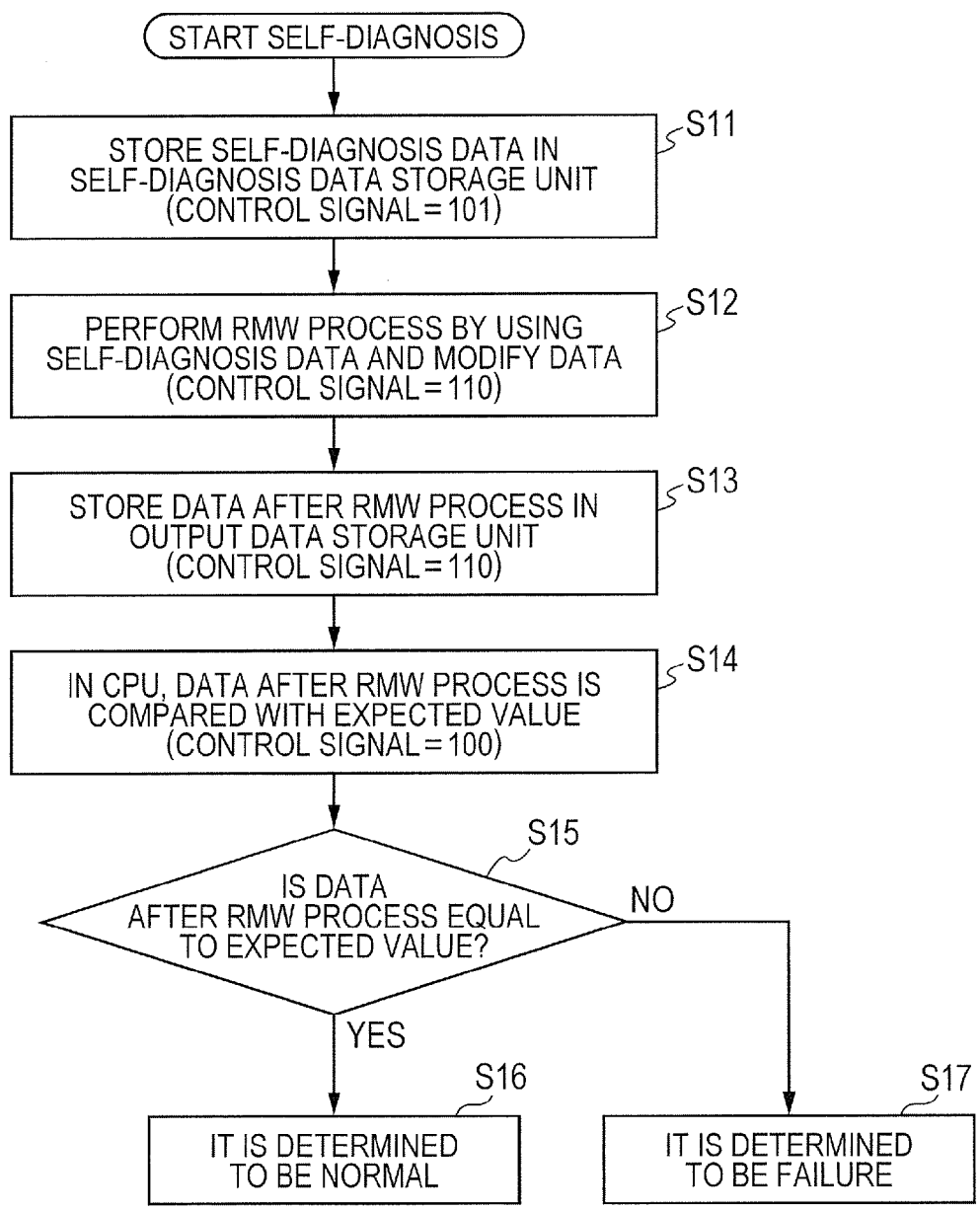
FIG. 6 is a flowchart for explaining an operation in self-diagnosis of the data processing device according to the first embodiment.
Figure 7:
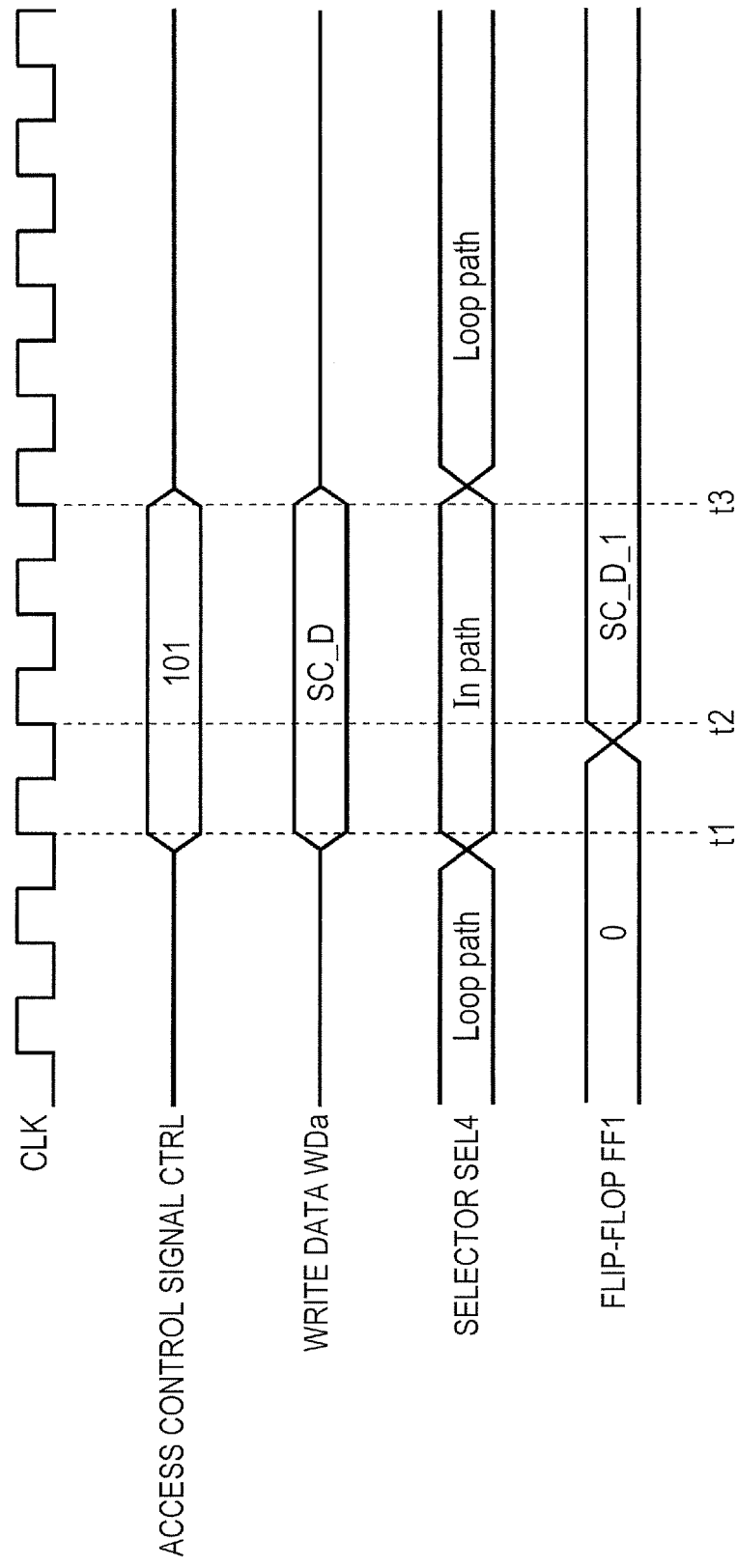
FIG. 7 is a timing chart for explaining the self-diagnosis operation of the data processing device according to the first embodiment.

Next, an operation in the self-diagnosis of the data processing device according to the present embodiment will be described. FIG. 6 is a flowchart for explaining the operation of the self-diagnosis of the data processing device according to the present embodiment. First, the CPU 10 stores the self-diagnosis data in the self-diagnosis data storage unit 31 (step S11). At this time, the CPU 10 outputs the access control signal "101". FIG. 7 is a timing chart for explaining the operation of step S11 in FIG. 6. At timing t1, the CPU 10 outputs the access control signal "101". Also, the CPU 10 outputs the self-diagnosis data SC_D as the write data WDa. At this time, since the access control signal is "101", the selector SEL4 (see FIG. 4) in the self-diagnosis data storage unit 31 selects an input path (that is, the write data WDa). Therefore, at timing t2, the self-diagnosis data SC_D is stored in the flip-flop FF1 in the self-diagnosis data storage unit 31. Thereafter, at timing t3, the access control signal becomes other than "101", so that the writing process of the self-diagnosis data is finished.

When the access control signal CTRL is other than "101", the selector SEL4 selects the self-diagnosis data SC_D outputted from the flip-flop FF1, so that the self-diagnosis data SC_D is outputted from the flip-flop FF1 according to the clock signal CLK (that is, the selector SEL4 and the flip-flop FF1 form a loop).

The operation in which the CPU 10 stores the self-diagnosis data in the self-diagnosis data storage unit 31 (step S11) may be performed only once when, for example, the data processing device is started. When updating the self-diagnosis data stored in the self-diagnosis data storage unit 31, the process of step S11 is performed again. In step S11, the access control signal CTRL is "101", so that the enable signal generation circuit 38 outputs the enable signal EN of low level to the memory 40. Therefore, the address signal ADD supplied to the memory 40 is invalidated and normal writing to the memory 40 is not performed.

Figure 8:
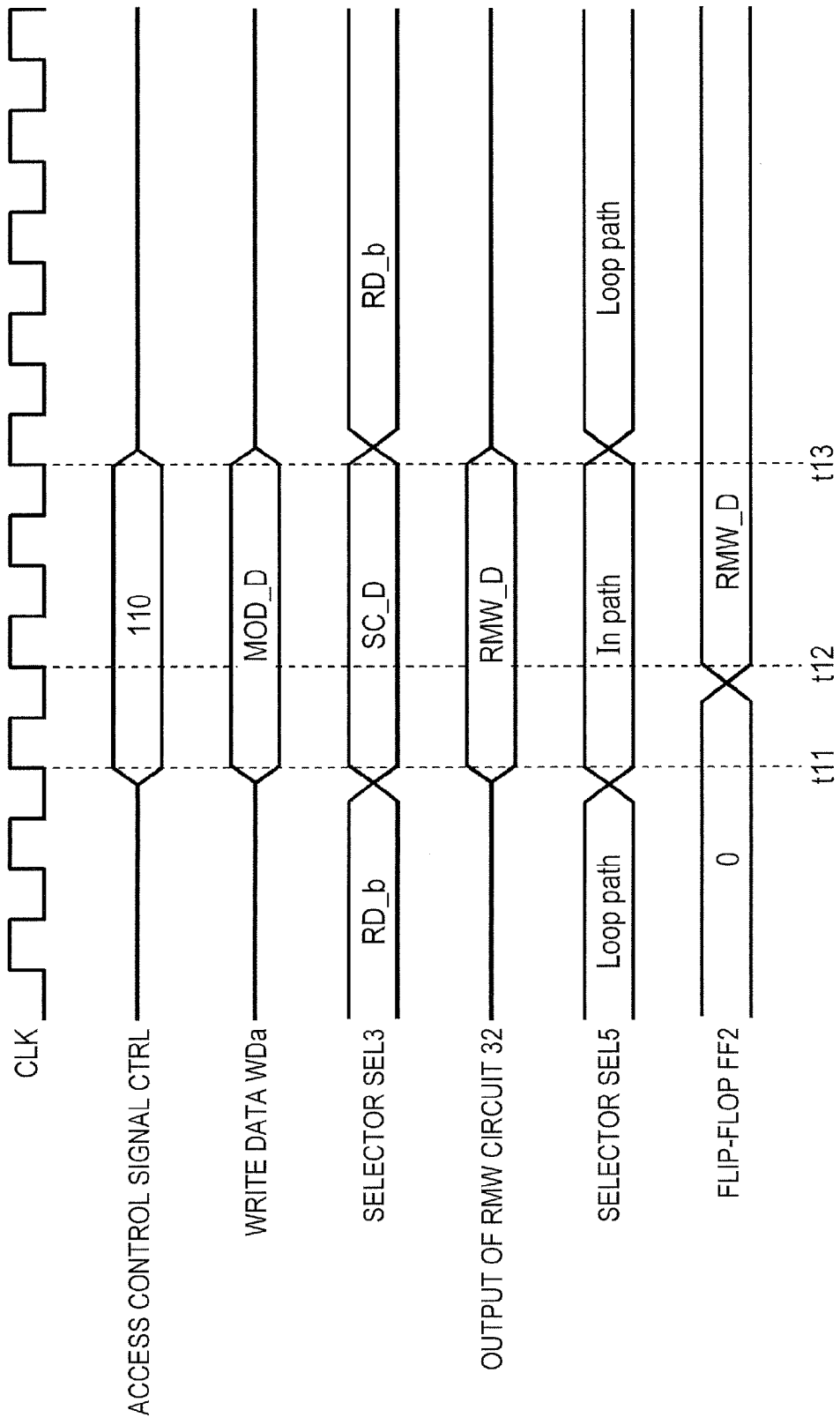
FIG. 8 is a timing chart for explaining the self-diagnosis operation of the data processing device according to the first embodiment.

Next, the RMW circuit 32 performs the RMW process by using the self-diagnosis data SC_D and the modify data MOD_D (step S12). Also, the RMW circuit 32 stores the output data RMW_D after the RMW process to the output data storage unit 37 (step S13). At this time, the CPU 10 outputs the access control signal "110". FIG. 8 is a timing chart for explaining the operation of steps S12 and S13 in FIG. 6. At timing t11, the CPU 10 outputs the access control signal "110". Also, the CPU 10 outputs the modify data MOD_D as the write data WDa. At this time, since the access control signal is "110", the selector SEL3 selects the self-diagnosis data SC_D stored in the self-diagnosis data storage unit 31. Therefore, the RMW circuit 32 modifies a part of the self-diagnosis data SC_D on the basis of the modify data MOD_D and outputs the modified data (output data) RMW_D. Since the access control signal is "110", the selector SEL5 (see FIG. 5) in the output data storage unit 37 selects an input path (that is, the output data RMW_D). Therefore, at timing t12, the output data RMW_D is stored in the flip-flop FF2 in the output data storage unit 37. Thereafter, at timing t13, the access control signal becomes other than "110", so that the RMW process of the RMW circuit is finished.

When the access control signal CTRL is other than "110", the selector SEL5 selects the output data RMW_D outputted from the flip-flop FF2, so that the output data RMW_D is outputted from the flip-flop FF2 according to the clock signal CLK (that is, the selector SEL5 and the flip-flop FF2 form a loop).

In step S12, the access control signal CTRL is "110", so that the enable signal generation circuit 38 outputs the enable signal EN of low level to the memory 40. Therefore, the address signal ADD supplied to the memory 40 is invalidated and normal RMW process is not performed on the memory 40.

Figure 9:
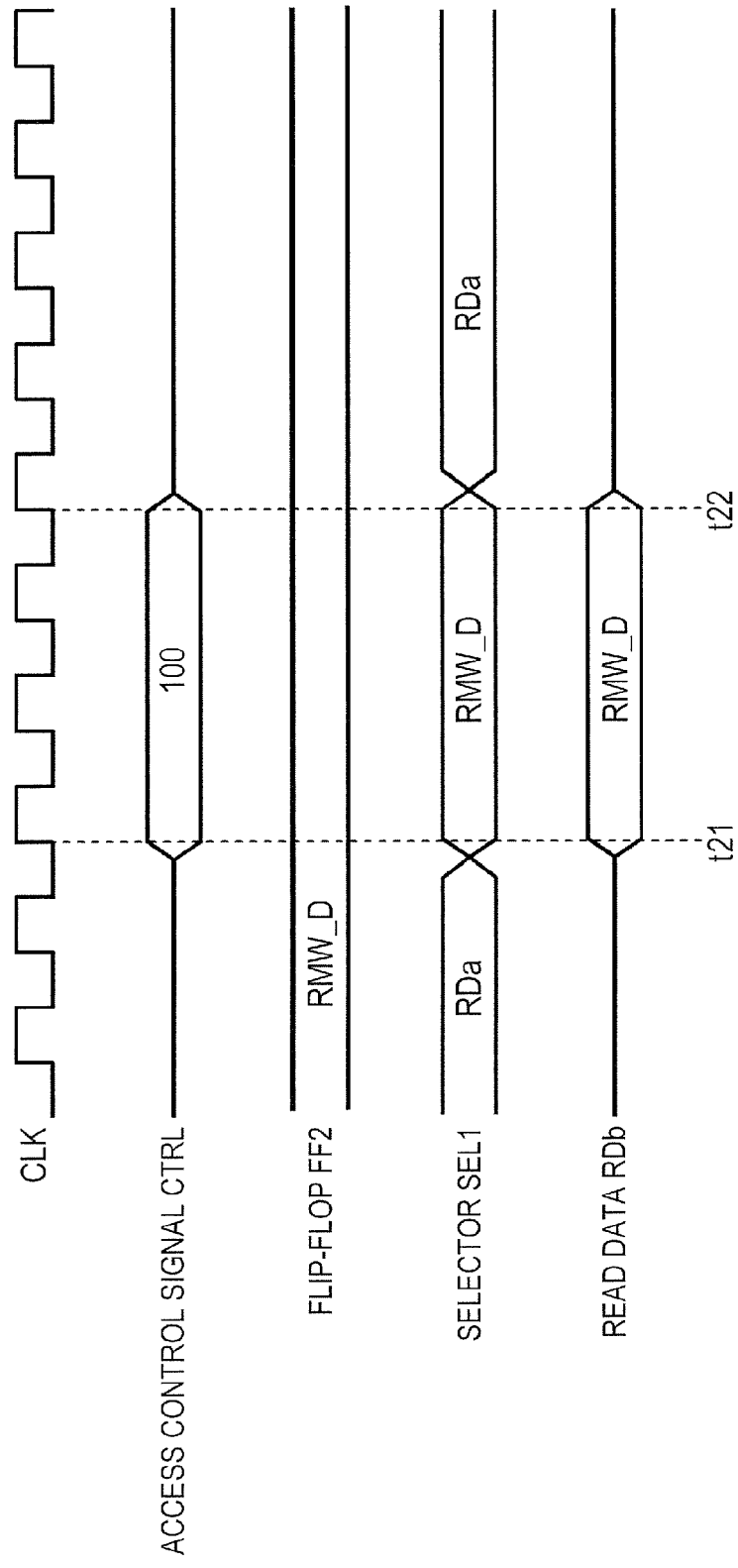
FIG. 9 is a timing chart for explaining the self-diagnosis operation of the data processing device according to the first embodiment.

Next, the CPU 10 reads the output data RMW_D stored in the output data storage unit 37 and the determination unit in the CPU 10 compares the output data RMW_D after the RMW process with an expected value (step S14). At this time, the CPU 10 outputs the access control signal "100". FIG. 9 is a timing chart for explaining a reading process of the output data RMW_D of step S14 in FIG. 6. At timing t21, the CPU 10 outputs the access control signal "100". At this time, the flip-flop FF2 (see FIG. 5) in the output data storage unit 37 outputs the output data RMW_D. Since the access control signal is "100", the selector SEL1 selects the output data RMW_D. Therefore, the output data RMW_D is outputted to the CPU 10 as the read data RDb. Thereafter, at timing t22, the access control signal becomes other than "100", so that the reading process of the output data RMW_D is finished.

The read output data RMW_D is compared with an expected value by the determination unit in the CPU 10. When the output data RMW_D corresponds to the expected value (step S15: Yes), it is determined that the RMW circuit 32 is normal (step S16). On the other hand, when the output data RMW_D does not correspond to the expected value (step S15: No), it is determined that the RMW circuit 32 fails (step S17).

FIGS. 10A to 10C are diagrams for explaining timing of the self-diagnosis in the data processing device according to the present embodiment. In FIGS. 10A to 10C, "RD" indicates a process for reading read data from the memory 40 (access control signal="000"), "WR" indicates a process for writing write data to the memory 40 (access control signal="001"), "RMW" indicates a normal RMW process (access control signal="010"), and "SC" indicates a self-diagnosis process (access control signal="100", "101", or "110"). The "RD", "WR", "RMW", and "SC" shown in FIGS. 10A to 10C are processed by a plurality of clock cycles.

As shown in FIG. 10A, the self-diagnosis process in the data processing device can be performed, for example, at predetermined intervals. Specifically, the intervals INT1, INT2, and INT3 are the same time intervals and the self-diagnosis process "SC" can be performed once in a predetermined time period by performing the self-diagnosis process "SC" once in each time interval. At this time, the intervals INT1, INT2, and INT3 are set to a time shorter than a time required for the microcontroller including the data processing device to recognize that the RMW circuit 32 fails from when the RMW circuit 32 fails, so that it is possible to prevent the microcontroller from malfunctioning due to the failure of the RMW circuit 32. In other words, when it is necessary for the microcontroller to more quickly recognize the failure of the RMW circuit 32, the intervals INT1, INT2, and INT3 are set to a smaller value. On the other hand, when it is not necessary for the microcontroller to so quickly recognize the failure of the RMW circuit 32, the intervals INT1, INT2, and INT3 can be set to a relatively large value. In this way, the intervals INT1, INT2, and INT3 can be arbitrarily set according to specifications required for the microcontroller.

As shown in FIG. 10B, the self-diagnosis process in the data processing device may be performed for each program Prog1, Prog2, and Prog3 to be executed. In the example shown in FIG. 10B, the self-diagnosis process "SC" is performed when each program is started. In this way, the self-diagnosis process "SC" is performed when each program is started, so that it is possible to prevent an error from occurring in the program to be executed. The self-diagnosis process "SC" may be performed when a program is ended or while a program is being executed in addition to when a program is started.

As shown in FIG. 10C, the self-diagnosis process in the data processing device may be performed immediately after a normal RMW process. In this way, the self-diagnosis process "SC" is performed immediately after a normal RMW process, so that it is possible to determine whether or not the normal RMW process performed immediately before the self-diagnosis process "SC" is normally performed.

The CPU 10 can set the timing of the self-diagnosis in the data processing device described above according to the microcontroller that uses the data processing device.

As described in BACKGROUND, nowadays, high reliability is required for data processing devices, so that high reliability is also required for data processing devices including the read-modify-write circuit. Therefore, for example, it is possible to improve the reliability of a data processing device by providing a self-diagnosis function to the read-modify-write circuit.

However, even when the self-diagnosis function is provided to the read-modify-write circuit, if there is a plurality of masters that access the memory, there is a risk that the read-modify-write circuit may be affected by accesses from other masters. In other words, there is a risk that a self-diagnosis result is altered by an access of another master, so that there is a problem that the reliability of the read-modify-write circuit degrades.

The data processing device according to the present embodiment diagnoses a failure of the read-modify-write circuit 32 by storing the self-diagnosis data used for the self-diagnosis in the self-diagnosis data storage unit 31, performing the read-modify-write process by using the self-diagnosis data stored in the self-diagnosis data storage unit 31 and the modify data, temporarily storing the output data after performing the read-modify-write process in the output data storage unit 37, and thereafter, comparing the output data with an expected value by the determination unit provided in the CPU 10. By using such a configuration, even when there is a plurality of masters that access the memory 40, it is possible to perform the self-diagnosis of the read-modify-write circuit 32 without being affected by the accesses from other masters (DMAC 2 and CPU 3 in FIG. 1). In other words, it is possible to prevent the diagnosis data (output data RMW_D) from being altered by the accesses from other masters.

It is considered to duplicate the read-modify-write circuit included in the data processing device to improve the reliability of the data processing device. However, when the read-modify-write circuit is duplicated, there is a problem that the circuit size and the power consumption increase. This problem appears notably when the distance between the CPU and the memory is large and when there is a plurality of masters that access the memory. Therefore, the data processing device which can perform the self-diagnosis of the read-modify-write circuit without duplicating the read-modify-write circuit is required. In particular, when the data processing device is used in a peripheral circuit where the processing frequency is low, it is necessary to reduce the circuit size of the data processing device as much as possible. Therefore, the data processing device which can perform the self-diagnosis of the read-modify-write circuit without duplicating the read-modify-write circuit is required. Hence, by using the data processing device according to the present embodiment, it is possible to perform the self-diagnosis of the read-modify-write circuit without duplicating the read-modify-write circuit.

The invention according to the present embodiment described above can provide a data processing device and a self-diagnosis method of the data processing device which can improve the reliability of the self-diagnosis of the read-modify-write circuit.

Second Embodiment

Figure 11:
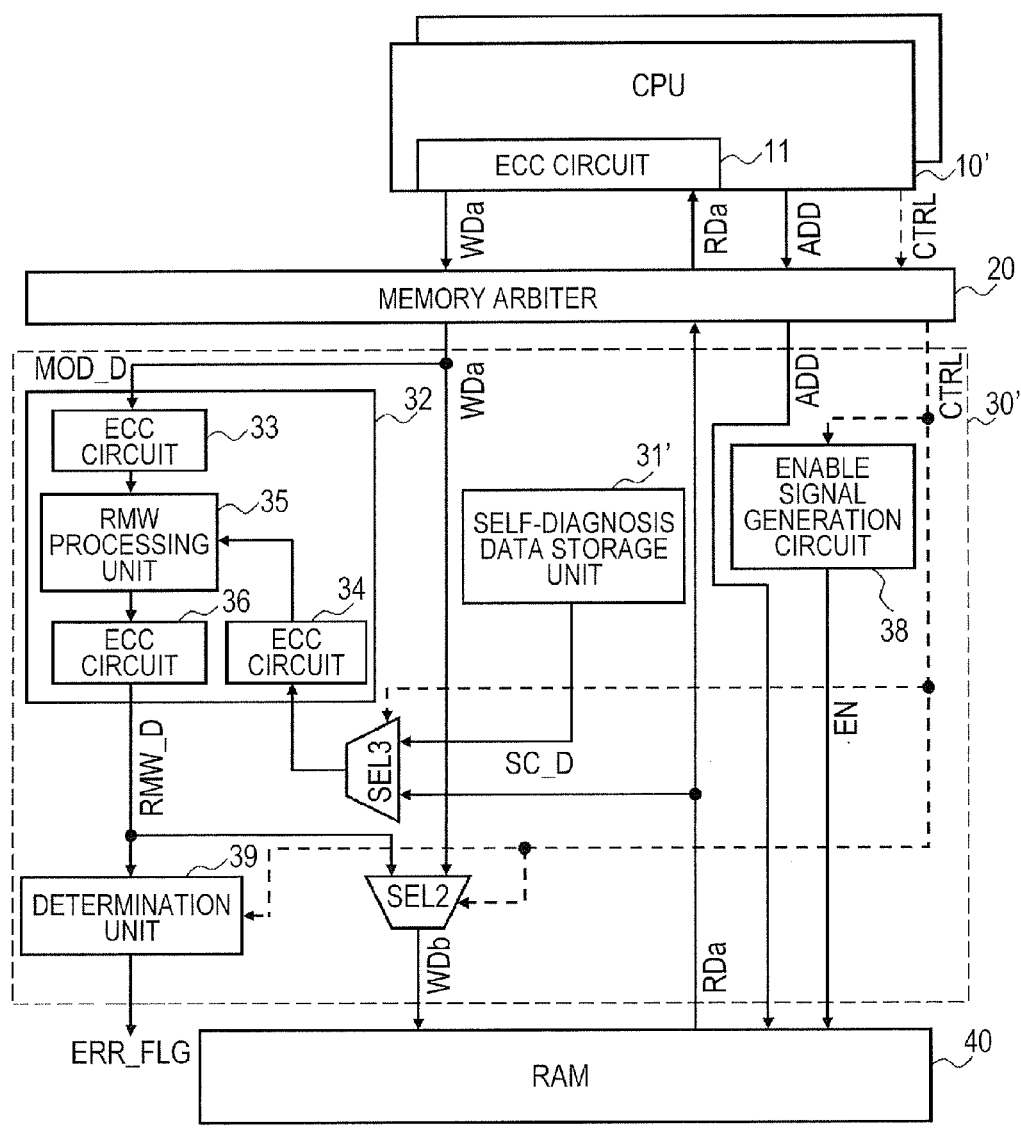
FIG. 11 is a block diagram showing a data processing device according to a second embodiment.

Next, a second embodiment of the present invention will be described. FIG. 11 is a block diagram showing the data processing device according to the present embodiment. The data processing device according to the present embodiment shown in FIG. 11 is different from the data processing device according to the first embodiment shown in FIG. 2 in the following points: an access control circuit 30' includes a determination unit 39, the output data storage unit 37 and the selector SEL1 included in the data processing device according to the first embodiment are not included, and the self-diagnosis data is stored in a self-diagnosis data storage unit 31' in advance. Components other than the above components are the same as those in the data processing device according to the first embodiment, so that the same components are denoted by the same reference numerals and redundant description will be omitted.

The self-diagnosis data storage unit 31' stores in advance the self-diagnosis data SC_D (first data) used when the self-diagnosis is performed. The self-diagnosis data storage unit 31' also outputs the self-diagnosis data SC_D to the selector SEL3. For example, the self-diagnosis data storage unit 31' includes a register and can store the self-diagnosis data SC_D in the register.

Figure 12:
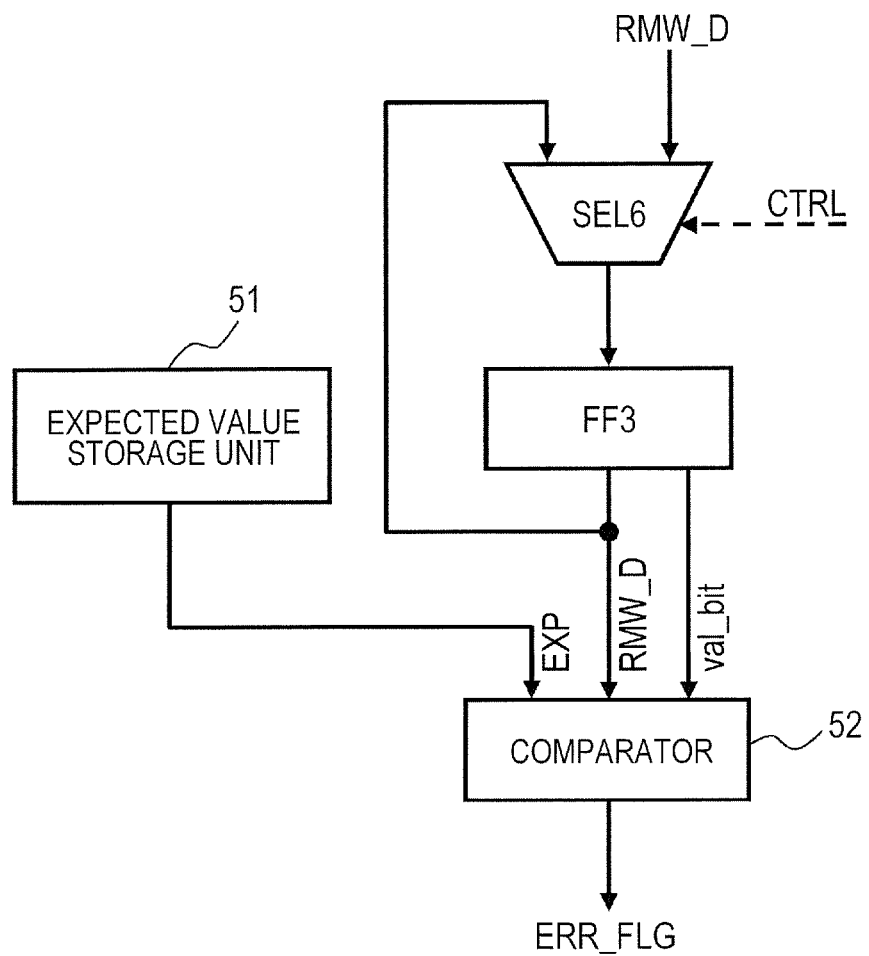
FIG. 12 is a diagram showing an example of a determination unit included in the data processing device according to the second embodiment.

The determination unit 39 diagnoses a failure of the RMW circuit 32 by comparing the output data RMW_D outputted from the RMW circuit 32 with an expected value stored in the determination unit in advance. FIG. 12 is a diagram showing an example of the determination unit included in the data processing device according to the present embodiment. As shown in FIG. 12, the determination unit 39 includes a selector SEL6, a flip-flop FF3, an expected value storage unit 51, and a comparator 52. The selector SEL6 selects the output data RMW_D outputted from the flip-flop FF3 or the output data RMW_D outputted from the RMW circuit 32 according to the access control signal CTRL and outputs the selected one to the flip-flop FF3. Specifically, when the access control signal CTRL is "110", the selector SEL6 selects the output data RMW_D outputted from the RMW circuit 32 and outputs the output data RMW_D to the flip-flop FF3.

The flip-flop FF3 stores the output data RMW_D according to the clock signal CLK. Also, the flip-flop FF3 outputs the output data RMW_D to the comparator 52 according to the clock signal CLK. At this time, when the flip-flop FF3 outputs the output data RMW_D to the comparator 52 for the first time, the flip-flop FF3 outputs "1" as a valid bit val_bit. When the flip-flop FF3 outputs the output data RMW_D to the comparator 52 for the second time and thereafter, the flip-flop FF3 outputs "0" as the valid bit val_bit. The valid bit val_bit is a signal for instructing the comparator 52 to perform comparison.

When the valid bit val_bit is "1", the comparator 52 compares the output data RMW_D outputted from the flip-flop FF3 with an expected value EXP outputted from the expected value storage unit 51. When the output data RMW_D corresponds to the expected value EXP, the comparator 52 outputs "0" indicating "normal" as a flag signal ERR_FLG. When the output data RMW_D does not correspond to the expected value EXP, the comparator 52 outputs "1" indicating "failure" as the flag signal ERR_FLG. When the valid bit val_bit is "0", the comparator 52 does not compare the output data RMW_D with the expected value EXP (that is, does not perform failure determination).

Here, the expected value EXP stored in the expected value storage unit 51 is a value determined based on the modify data MOD_D outputted by the CPU 10' and the self-diagnosis data SC_D stored in the self-diagnosis data storage unit 31'. Therefore, the expected value EXP can be a fixed value by setting the self-diagnosis data SC_D stored in the self-diagnosis data storage unit 31' and the modify data MOD_D outputted by the CPU 10' to a fixed value.

The read-modify-write circuit 32, the enable signal generation circuit 38, and the selectors SEL2 and SEL3 are the same as those in the data processing device described in the first embodiment, so that redundant description will be omitted. The CPU 10' is the same as the CPU 10 in the data processing device described in the first embodiment except that the CPU 10' does not include the determination unit.

Figure 13:
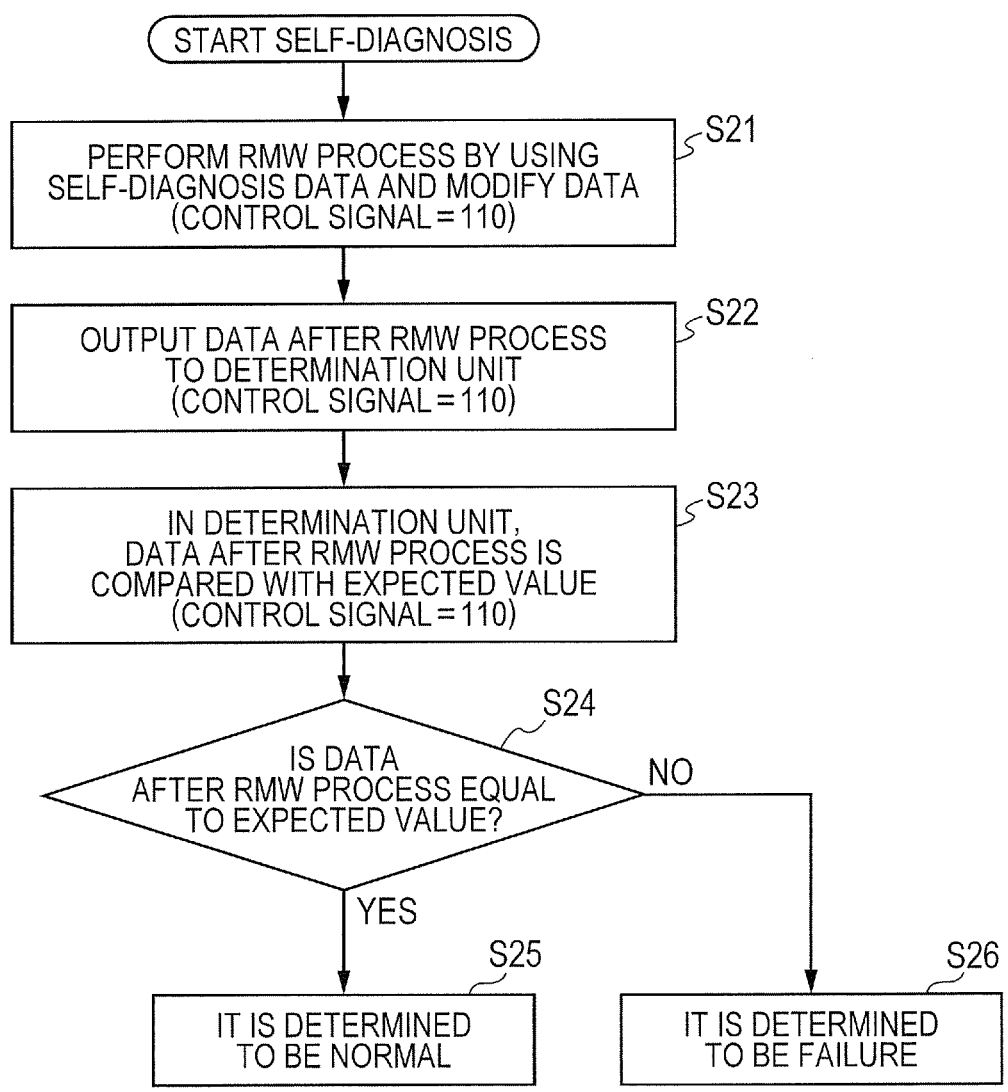
FIG. 13 is a flowchart for explaining an operation in self-diagnosis of the data processing device according to the second embodiment.

Next, an operation in the self-diagnosis of the data processing device according to the present embodiment will be described. FIG. 13 is a flowchart for explaining the operation of the self-diagnosis of the data processing device according to the present embodiment. First, the RMW circuit 32 performs the RMW process by using the self-diagnosis data SC_D stored in the self-diagnosis data storage unit 31' and the modify data MOD_D outputted from the CPU 10' (step S21).

The operation in step S21 will be described in detail. First, the CPU 10' outputs the access control signal "110". Also, the CPU 10' outputs the modify data MOD_D. At this time, since the access control signal is "110", the selector SEL3 selects the self-diagnosis data SC_D stored in the self-diagnosis data storage unit 31'. Therefore, the RMW circuit 32 generates the output data RMW_D by modifying a part of the self-diagnosis data SC_D on the basis of the modify data MOD_D (RMW process).

The generated output data RMW_D is outputted to the determination unit 39 (step S22). Thereafter, in the determination unit 39, the output data RMW_D is compared with an expected value (step S23). Specifically, since the access control signal is "110", the selector SEL6 in the determination unit 39 shown in FIG. 12 selects an input path (that is, the output data RMW_D). Therefore, the output data RMW_D is stored in the flip-flop FF3. The flip-flop FF3 outputs the output data RMW_D to the comparator 52 according to the clock signal CLK. At this time, the flip-flop FF3 outputs "1" as a valid bit val_bit.

Since the valid bit val_bit is "1", the comparator 52 compares the output data RMW_D outputted from the flip-flop FF3 with an expected value EXP outputted from the expected value storage unit 51. When the output data RMW_D corresponds to the expected value EXP (step S24: Yes), the comparator 52 outputs "0" indicating "normal" as a flag signal ERR_FLG (step S25). On the other hand, when the output data RMW_D does not correspond to the expected value EXP (step S24: No), the comparator 52 outputs "1" indicating "failure" as the flag signal ERR_FLG (step S26).

As described above, the data processing device according to the present embodiment diagnoses a failure of the read-modify-write circuit 32 by storing the self-diagnosis data used for the self-diagnosis in the self-diagnosis data storage unit 31' in advance, performing the read-modify-write process by using the self-diagnosis data stored in the self-diagnosis data storage unit 31' and the modify data, and comparing the output data after performing the read-modify-write process with an expected value by the determination unit.

Therefore, it is possible to improve the reliability of the self-diagnosis of the read-modify-write circuit. Specifically, in the data processing device according to the present embodiment, even when there is a plurality of masters that access the memory 40, it is possible to perform the self-diagnosis of the read-modify-write circuit 32 without being affected by the accesses from other masters (DMAC 2 and CPU 3 in FIG. 1). In other words, it is possible to prevent the diagnosis data (output data RMW_D) from being altered by the accesses from other masters. In the data processing device according to the present embodiment, it is possible to perform the self-diagnosis of the read-modify-write circuit without duplicating the read-modify-write circuit.

The invention according to the present embodiment described above can provide a data processing device and a self-diagnosis method of the data processing device which can improve the reliability of the self-diagnosis of the read-modify-write circuit.

The data processing devices according to the first and the second embodiments described above may be appropriately combined with each other. For example, the self-diagnosis data storage unit 31 of the data processing device according to the first embodiment may be configured by using the self-diagnosis data storage unit 31' of the data processing device according to the second embodiment. In other words, it is possible to configure the self-diagnosis data storage unit 31 so that the self-diagnosis data storage unit 31 stores the self-diagnosis data SC_D in advance instead of storing the self-diagnosis data SC_D outputted from the CPU 10. Although, in the second embodiment, the determination unit 39 is provided inside the access control circuit 30', the determination unit 39 may be provided outside the access control circuit 30'.

Third Embodiment

Figure 14:
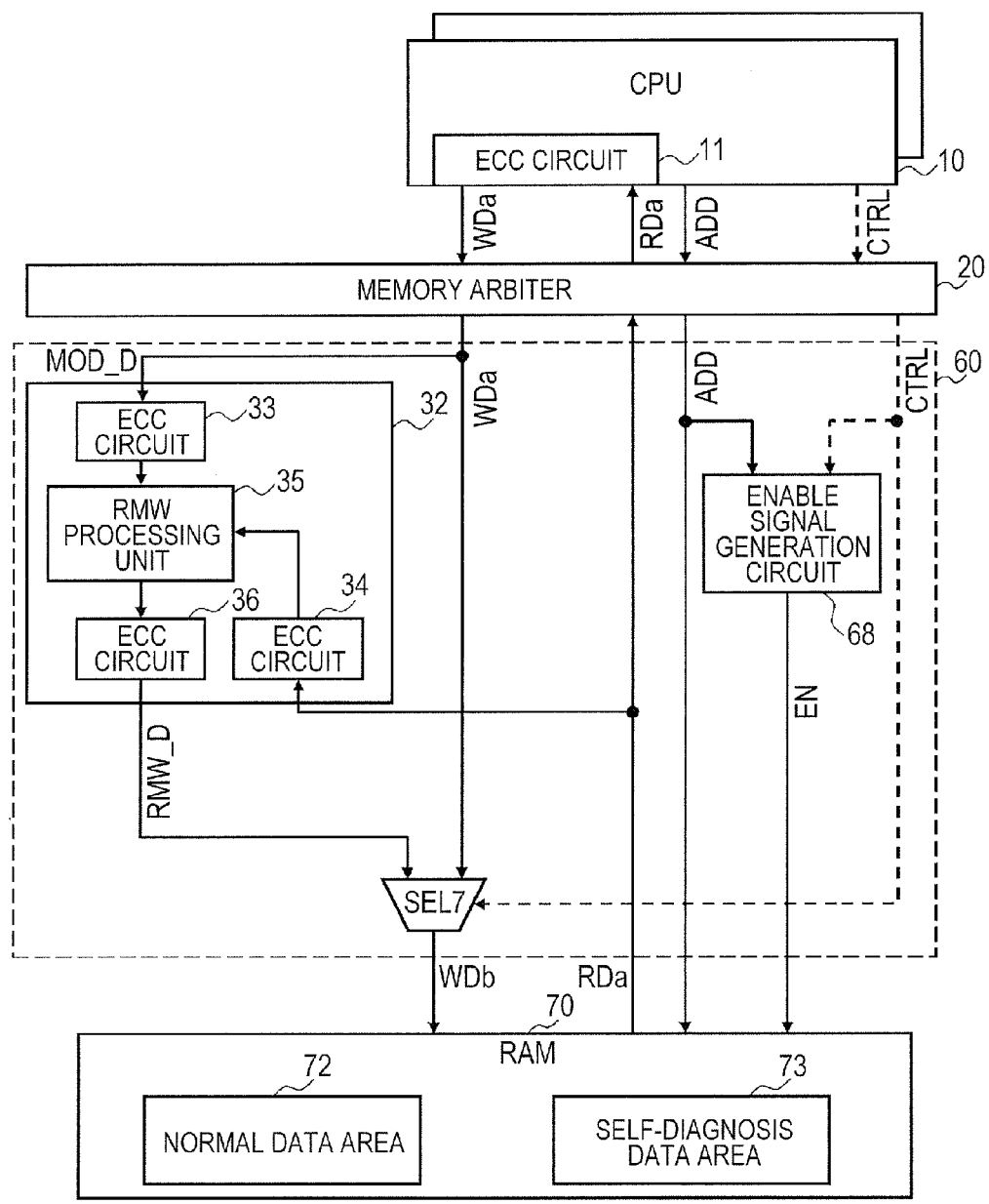
FIG. 14 is a block diagram showing a data processing device according to a third embodiment.

Next, a third embodiment of the present invention will be described. FIG. 14 is a block diagram showing the data processing device according to the present embodiment. As shown in FIG. 14, the data processing device according to the present embodiment includes a CPU 10, a memory arbiter 20, an access control circuit 60, and a memory 70. The CPU 10, the memory arbiter 20, the access control circuit 60, and the memory 70 included in the data processing device are provided with a common clock signal CLK from a clock generation circuit 90. The configuration and the operation of the CPU 10 and the memory arbiter 20 included in the data processing device according to the present embodiment are the same as those in the first embodiment, so that redundant description will be omitted. Components other than the above, which are the same as those in the first embodiment, are denoted by the same reference numerals and redundant description will be omitted.

The memory 70 stores the write data WDb outputted from the access control circuit 60 and outputs the read data RDa to the access control circuit 60. At this time, the memory 70 stores an error correcting code ECC added to the write data WDb in association with the write data WDb. When the memory 70 receives a read instruction from the CPU 10, the memory 70 outputs the read data RDa and an error correcting code ECC associated with the read data RDa.

The memory 70 includes a normal data area 72 and a self-diagnosis data area 73. The normal data area 72 is an area for storing a normal data (that is, data other than data used for the self-diagnosis of the RMW circuit 62). The self-diagnosis data area 73 is an area for storing the data used for the self-diagnosis of the RMW circuit 62. An address corresponding to the normal data area 72 and an address corresponding to the self-diagnosis data area 73 are determined in advance and a data area accessed by the CPU 10 is determined according to the address signal ADD outputted from the CPU 10.

The access control signal CTRL, the address signal ADD, and the write data WDa outputted from the CPU 10 through the memory arbiter 20 are inputted into the access control circuit 60 and the access control circuit 60 outputs the read data RDa to the CPU 10 through the memory arbiter 20. The access control circuit 30 writes the write data WDb to the memory 70 and reads the read data RDa from the memory 70. In summary, the access control circuit 60 controls transmission and reception of data performed between the CPU 10 and the memory 70 on the basis of the access control signal CTRL outputted from the CPU 10 through the memory arbiter 20. The relationship between the access control signal CTRL and the process of the access control circuit 60 is the same as that in the first embodiment (see FIG. 3).

The access control circuit 60 includes an RMW circuit 32, an enable signal generation circuit 68, and a selector SEL7. Since the RMW circuit 32 is the same as that in the first embodiment, redundant description will be omitted.

The enable signal generation circuit 68 generates an enable signal EN that validates/invalidates an access from the CPU 10 to the memory 70 according to the access control signal CTRL and the address signal ADD outputted from the CPU 10. Specifically, when the access control signal CTRL is an access control signal CTRL that indicates the self-diagnosis command (that is, the value of the most significant bit of the access control signal CTRL is "1") and the address signal ADD is an address corresponding to the self-diagnosis data area 73, the enable signal generation circuit 68 outputs the enable signal EN of high level to the memory 70. In this case, the enable signal EN is high level, so that the address signal ADD supplied to the memory 70 is recognized as valid. As a result, the access from the CPU 10 to the self-diagnosis data area 73 of the memory 70 is allowed.

On the other hand, when the value of the most significant bit of the access control signal CTRL is "1" and the address signal ADD is an address of the normal data area 72 of the memory 70, the enable signal generation circuit 68 outputs the enable signal EN of low level to the memory 70. In this case, the enable signal EN is low level, so that the address signal ADD supplied to the memory 70 is recognized as invalid. As a result, the access from the CPU 10 to the self-diagnosis data area 72 of the memory 70 is prohibited.

When the access control signal CTRL is an access control signal CTRL that indicates a normal access (that is, the value of the most significant bit of the access control signal CTRL is "0") and the address signal ADD is an address corresponding to the self-diagnosis data area 73, the enable signal generation circuit 68 outputs the enable signal EN of low level to the memory 70. In this case, the enable signal EN is low level, so that the address signal ADD supplied to the memory 70 is recognized as invalid. As a result, the access from the CPU 10 to the self-diagnosis data area 73 of the memory 70 is prohibited.

On the other hand, when the value of the most significant bit of the access control signal CTRL is "0" and the address signal ADD is an address of the normal data area 72 of the memory 70, the enable signal generation circuit 68 outputs the enable signal EN of high level to the memory 70. In this case, the enable signal EN is high level, so that the address signal ADD supplied to the memory 70 is recognized as valid. As a result, the access from the CPU 10 to the self-diagnosis data area 72 of the memory 70 is allowed.

In the enable signal generation circuit 68, information related to the address corresponding to the normal data area 72 and the address corresponding to the self-diagnosis data area 73 is stored.

The selector SEL7 selects either one of the output data RMW_D outputted from the RMW circuit 32 and the write data WDa outputted from the CPU 10 according to the access control signal CTRL and outputs the selected data as the write data WDb.

The CPU 10 of the data processing device according to the present embodiment includes a determination unit. When the access control signal CTRL is a signal indicating the self-diagnosis command, the determination unit diagnoses a failure of the RMW circuit 32 by comparing the output data RMW_D generated by the RMW circuit 32 with an expected value.

Next, an operation of the data processing device according to the present embodiment will be described.

First, a normal operation will be described. When the CPU 10 reads read data from the memory 70, the CPU 10 outputs the access control signal CTRL "000". Also, the CPU 10 outputs an address ADD_rd of the read data (address corresponding to the normal data area 72) as the address signal ADD. At this time, the value of the most significant bit of the access control signal CTRL is "0" and the address ADD_rd is the address of the normal data area 72, so that the enable signal generation circuit 68 outputs the enable signal EN of high level to the memory 70. Since the enable signal EN is high level, the memory 70 recognizes the address ADD_rd as valid and outputs the read data RDa (including an error correcting code ECC) according to the address ADD_rd to the memory arbiter 20. The memory arbiter 20 outputs the read data RDa to the CPU 10.

When the CPU 10 writes write data to the memory 70, the CPU 10 outputs the access control signal CTRL "001" and the write data WDa (including an error correcting code ECC). Also, the CPU 10 outputs an address ADD_wr of the write destination of the write data (address corresponding to the normal data area 72) as the address signal ADD. At this time, the value of the most significant bit of the access control signal CTRL is "0" and the address ADD_wr is the address of the normal data area 72, so that the enable signal generation circuit 68 outputs the enable signal EN of high level to the memory 70. Since the access control signal CTRL is "001", the selector SEL7 selects the write data WDa and outputs the write data WDa to the memory 70 as the write data WDb. Here, the write data WDb is data selected by the selector SEL7. In this case, the write data WDb is the same as the write data WDa. Since the enable signal EN is high level, the memory 70 recognizes the address ADD_wr as valid and the write data WDb (including an error correcting code ECC) is written to an address corresponding to the address ADD_wr of the normal data area 72 in the memory 70.

When the CPU 10 performs the RMW process, the CPU 10 outputs the access control signal CTRL "010". Also, the CPU 10 outputs the modify data MOD_D (including an error correcting code ECC) as the write data WDa and outputs an address ADD_rmw (address corresponding to the normal data area 72), at which data to be processed in the RMW process is stored, as the address signal ADD. At this time, the value of the most significant bit of the access control signal CTRL is "0" and the address ADD_rmw is the address of the normal data area 72, so that the enable signal generation circuit 68 outputs the enable signal EN of high level to the memory 70. Since the enable signal EN is high level, the memory 70 recognizes the address ADD_rmw as valid and outputs the read data RDa corresponding to the address ADD_rmw to the RMW circuit 32. The RMW circuit 32 modifies a part of the read data RDa on the basis of the modify data MOD_D and outputs the modified data (output data) RMW_D. Since the access control signal CTRL is "010", the selector SEL7 selects the output data RMW_D of the RMW circuit 32 and outputs the selected output data RMW_D to the memory 70. In the memory 70, the output data RMW_D (including an error correcting code ECC) is written to an address corresponding to the address ADD_rmw.

Next, an operation in the self-diagnosis of the data processing device according to the present embodiment will be described.

Figure 15:
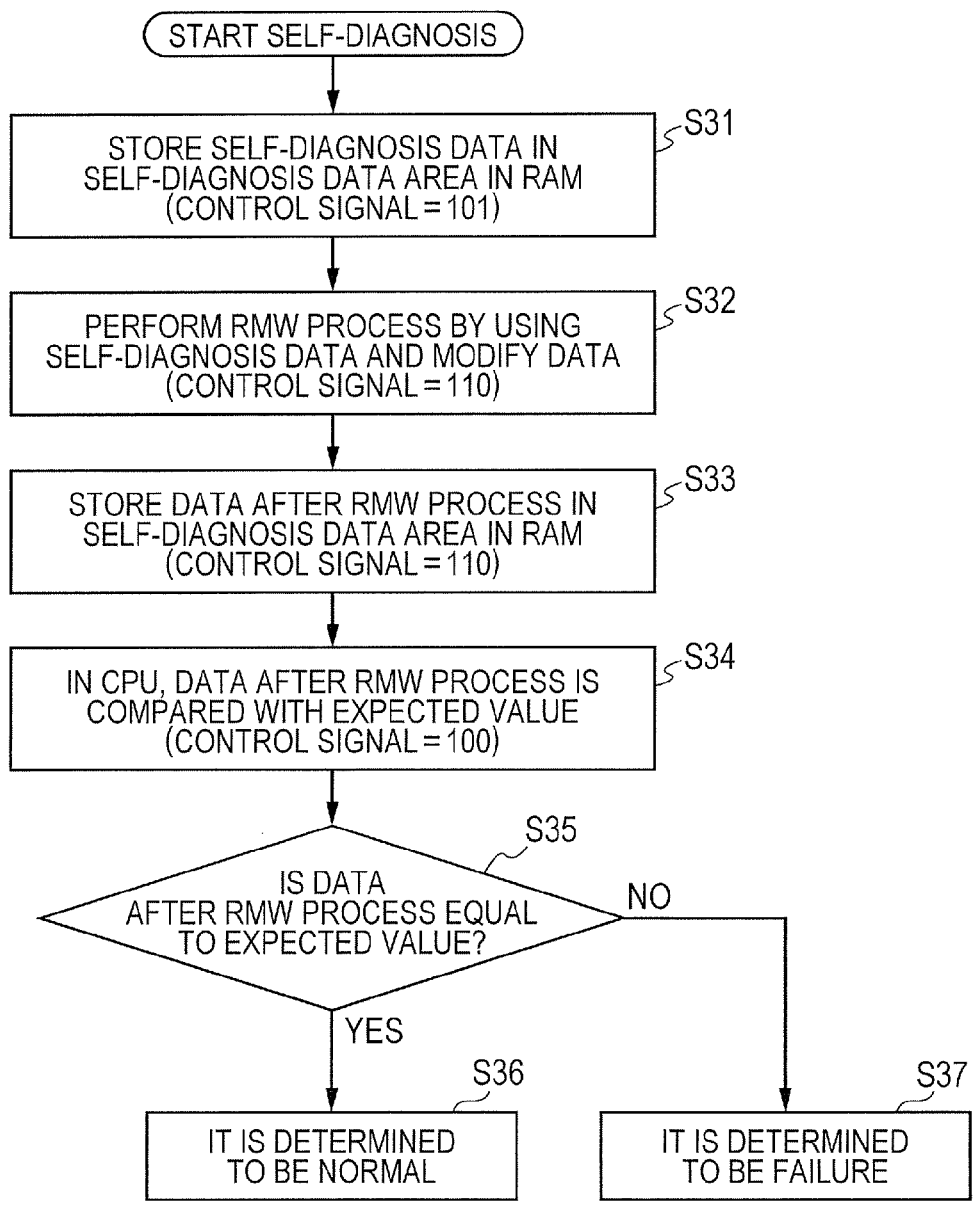
FIG. 15 is a flowchart for explaining an operation in self-diagnosis of the data processing device according to the third embodiment.

FIG. 15 is a flowchart for explaining the operation of the self-diagnosis of the data processing device according to the present embodiment. First, the CPU 10 stores the self-diagnosis data in the self-diagnosis data area 73 in the memory 70 (step S31). At this time, the CPU 10 outputs the access control signal "101".

The operation in step S31 will be described in detail. First, the CPU 10 outputs the access control signal "101". Also, the CPU 10 outputs the self-diagnosis data SC_D as the write data WDa and outputs an address ADD_sc (address corresponding to the self-diagnosis data area 73), at which the self-diagnosis data SC_D is stored, as the address signal ADD. At this time, since the access control signal is "101", the selector SEL7 selects the write data WDa (that is, the self-diagnosis data SC_D). Since the value of the most significant bit of the access control signal CTRL is "0" and the address ADD_sc is the address of the self-diagnosis data area 73, the enable signal generation circuit 68 outputs the enable signal EN of high level to the memory 70. Since the enable signal EN is high level, the memory 70 recognizes the address ADD_sc as valid and stores the self-diagnosis data SC_D at the address ADD_sc of the self-diagnosis data area 73.

Next, the RMW process is performed by using the self-diagnosis data SC_D and the modify data MOD_D (step S32). Then, the output data RMW_D after the RMW process is stored in the self-diagnosis data area 73 in the memory 70 (step S33).

The operation in steps S32 and S33 will be described in detail. First, the CPU 10 outputs the access control signal "110". Also, the CPU 10 outputs the modify data MOD_D (including an error correcting code ECC) as the write data WDa. Also, the CPU 10 outputs the address ADD_sc at which the self-diagnosis data SC_D is stored. At this time, since the value of the most significant bit of the access control signal CTRL is "1" and the address ADD_sc is the address of the self-diagnosis data area 73, the enable signal generation circuit 68 outputs the enable signal EN of high level to the memory 70. Since the enable signal EN is high level, the memory 70 recognizes the address ADD_sc as valid and outputs the read data RDa corresponding to the address ADD_sc (that is, the self-diagnosis data SC_D) to the RMW circuit 32. The RMW circuit 32 modifies a part of the self-diagnosis data SC_D on the basis of the modify data MOD_D and outputs the modified data (output data) RMW_D. Since the access control signal CTRL is "110", the selector SEL7 selects the output data RMW_D of the RMW circuit 32 and outputs the selected output data RMW_D to the memory 70. In the memory 70, the output data RMW_D (including an error correcting code ECC) is written to an address corresponding to the address ADD_sc of the self-diagnosis data area 73.

Next, the CPU 10 reads the output data RMW_D stored in the self-diagnosis data area 73 in the memory 70 and the determination unit in the CPU 10 compares the output data RMW_D after the RMW process with an expected value (step S34).

At this time, the CPU 10 outputs the access control signal "100". Also, the CPU 10 outputs the address ADD_sc (address corresponding to the self-diagnosis data area 73), at which the output data RMW_D is stored, as the address signal ADD. At this time, since the value of the most significant bit of the access control signal CTRL is "1" and the address ADD_sc is the address of the self-diagnosis data area 73, the enable signal generation circuit 68 outputs the enable signal EN of high level to the memory 70. Since the enable signal EN is high level, the memory 70 recognizes the address ADD_sc as valid and outputs the output data RMW_D (including an error correcting code ECC) according to the address ADD_sc to the memory arbiter 20. The memory arbiter 20 outputs the output data RMW_D to the CPU 10.

Then, the read output data RMW_D is compared with an expected value by the determination unit in the CPU 10. When the output data RMW_D corresponds to the expected value (step S35: Yes), it is determined that the RMW circuit 32 is normal (step S36). On the other hand, when the output data RMW_D does not correspond to the expected value (step S35: No), it is determined that the RMW circuit 32 fails (step S37).

In this way, the data processing device according to the present embodiment diagnoses a failure of the read-modify-write circuit 32 by storing the self-diagnosis data used for the self-diagnosis in the self-diagnosis data area 73 in the memory 70, performing the read-modify-write process by using the self-diagnosis data stored in the self-diagnosis data area 73 and the modify data, temporarily storing the output data after performing the read-modify-write process in the self-diagnosis data area 73 in the memory 70, and thereafter, comparing the output data with an expected value by the determination unit provided in the CPU 10.

Therefore, it is possible to improve the reliability of the self-diagnosis of the read-modify-write circuit. Specifically, in the data processing device according to the present embodiment, the self-diagnosis data area 73 separated from the normal data area 72 is provided in the memory 70 and the access to the self-diagnosis data area 73 is limited by using the enable signal generation circuit 68, so that even when there is a plurality of masters that access the memory 70, it is possible to perform the self-diagnosis of the read-modify-write circuit 32 without being affected by the accesses from other masters (DMAC 2 and CPU 3 in FIG. 1). In other words, it is possible to prevent the diagnosis data (output data RMW_D) from being altered by the accesses from other masters. In the data processing device according to the present embodiment, it is possible to perform the self-diagnosis of the read-modify-write circuit without duplicating the read-modify-write circuit.

In the present embodiment, a case in which the self-diagnosis data SC_D is outputted from the CPU 10 and written to the self-diagnosis data area 73 in the memory 70 (step S31 in FIG. 15) has been described. However, the self-diagnosis data SC_D may be stored in the self-diagnosis data area 73 in the memory 70 in advance.

The invention according to the present embodiment described above can provide a data processing device and a self-diagnosis method of the data processing device which can improve the reliability of the self-diagnosis of the read-modify-write circuit.

Fourth Embodiment

Figure 16:
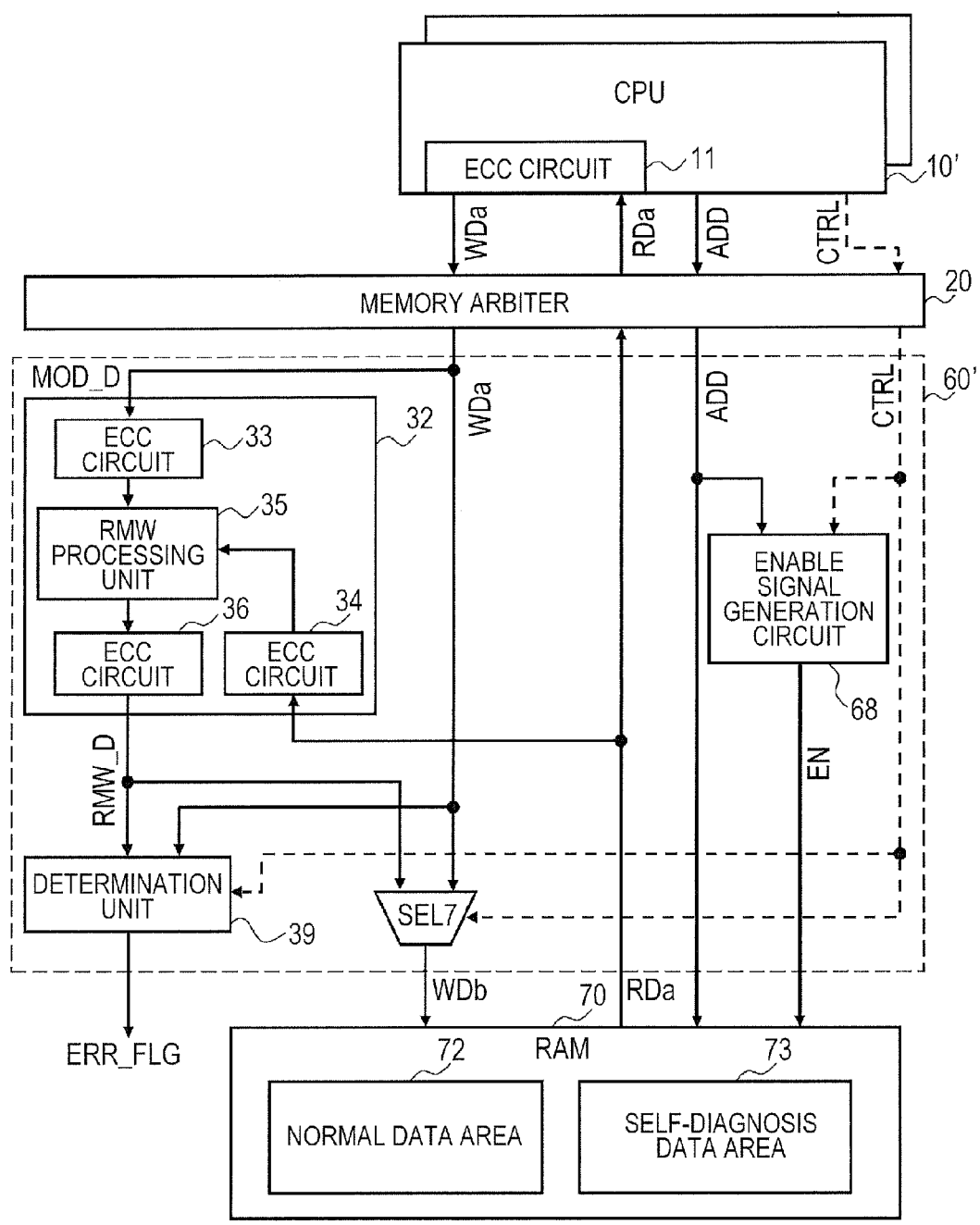
FIG. 16 is a block diagram showing a data processing device according to a fourth embodiment.

Next, a fourth embodiment of the present invention will be described. FIG. 16 is a block diagram showing the data processing device according to the present embodiment. The data processing device according to the present embodiment shown in FIG. 16 is different from the data processing device according to the third embodiment shown in FIG. 14 in a point that the CPU does not include the determination unit but an access control circuit 60' includes the determination unit 39. Components other than the above components are the same as those in the data processing device according to the third embodiment, so that the same components are denoted by the same reference numerals and redundant description will be omitted.

The determination unit 39 diagnoses a failure of the RMW circuit 32 by comparing the output data RMW_D outputted from the RMW circuit 32 with an expected value stored in the determination unit in advance. The configuration and the operation of the determination unit 39 are the same as those of the determination unit 39 described in the second embodiment (see FIG. 12), so that redundant description will be omitted.

Also, the read-modify-write circuit 32, the enable signal generation circuit 68, and the selector SEL7 are the same as those in the data processing device described in the third embodiment, so that redundant description will be omitted. The CPU 10' is the same as the CPU 10 in the data processing device described in the third embodiment except that the CPU 10' does not include the determination unit.

Next, an operation in the self-diagnosis of the data processing device according to the present embodiment will be described.

Figure 17:
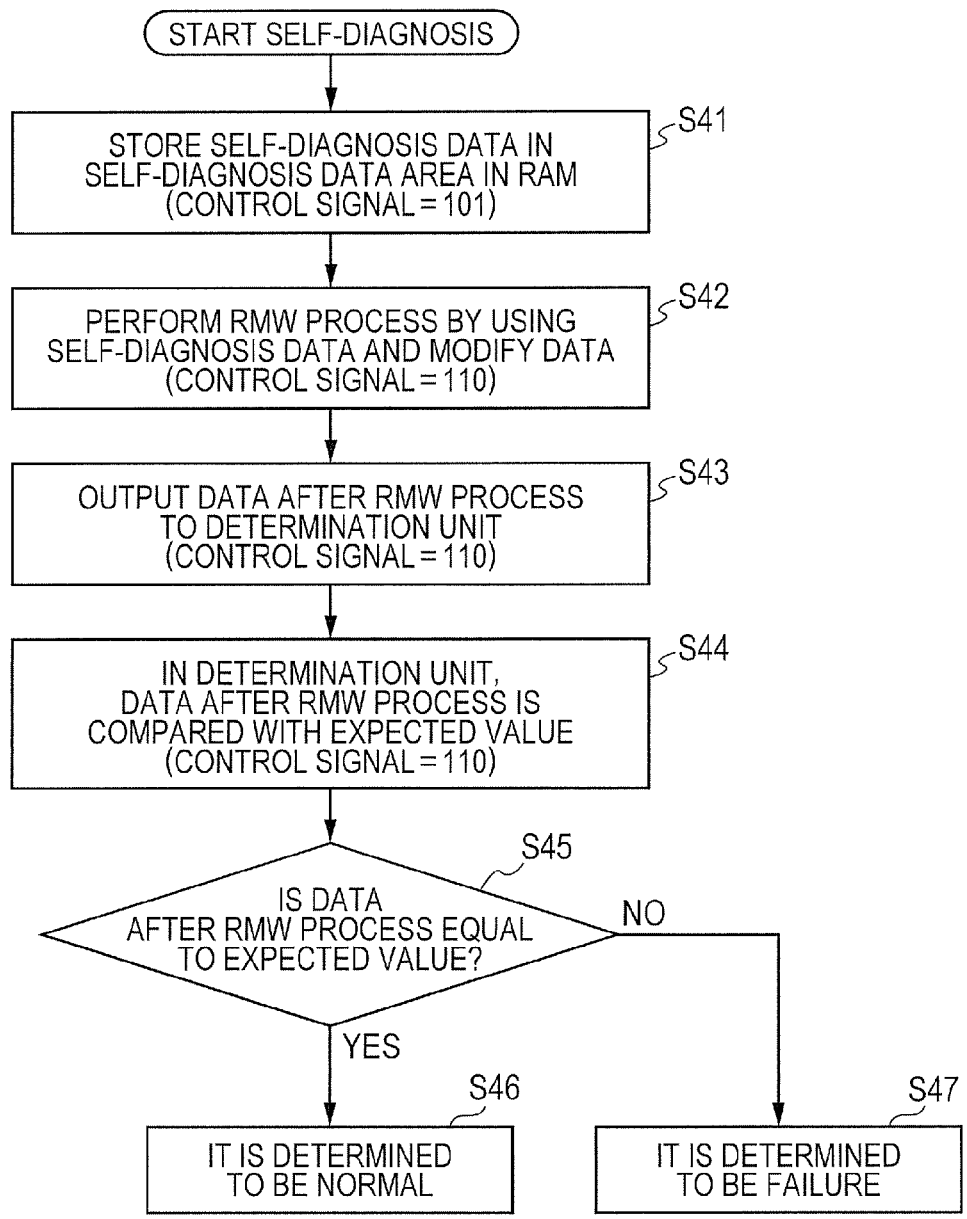
FIG. 17 is a flowchart for explaining an operation in self-diagnosis of the data processing device according to the fourth embodiment.

FIG. 17 is a flowchart for explaining the operation of the self-diagnosis of the data processing device according to the present embodiment. First, the CPU 10' stores the self-diagnosis data in the self-diagnosis data area 73 in the memory 70 (step S41). At this time, the CPU 10' outputs the access control signal "101". The operation in step S41 is the same as that in step S31 described in the third embodiment.

Next, the RMW process is performed by using the self-diagnosis data SC_D and the modify data MOD_D (step S42). Then, the output data RMW_D after the RMW process is outputted to the determination unit 39 (step S43).

The operation in steps S42 and S43 will be described in detail. First, the CPU 10' outputs the access control signal "110". Also, the CPU 10' outputs the modify data MOD_D (including an error correcting code ECC) as the write data WDa. Also, the CPU 10' outputs the address ADD_sc at which the self-diagnosis data SC_D is stored. At this time, since the value of the most significant bit of the access control signal CTRL is "1" and the address ADD_sc is the address of the self-diagnosis data area 73, the enable signal generation circuit 68 outputs the enable signal EN of high level to the memory 70. Since the enable signal EN is high level, the memory 70 recognizes the address ADD_sc as valid and outputs the read data RDa corresponding to the address ADD_sc (that is, the self-diagnosis data SC_D) to the RMW circuit 32. The RMW circuit 32 modifies a part of the self-diagnosis data SC_D on the basis of the modify data MOD_D and outputs the modified data (output data) RMW_D to the determination unit 39.

The determination unit 39 compares the output data RMW_D after the RMW process with an expected value (step S44). Specifically, since the access control signal is "110", the selector SEL6 in the determination unit 39 shown in FIG. 12 selects an input path (that is, the output data RMW_D). Therefore, the output data RMW_D is stored in the flip-flop FF3. The flip-flop FF3 outputs the output data RMW_D to the comparator 52 according to the clock signal CLK. At this time, the flip-flop FF3 outputs "1" as a valid bit val_bit.

Since the valid bit val_bit is "1", the comparator 52 compares the output data RMW_D outputted from the flip-flop FF3 with an expected value EXP outputted from the expected value storage unit 51. When the output data RMW_D corresponds to the expected value EXP (step S45: Yes), the comparator 52 outputs "0" indicating "normal" as a flag signal ERR_FLG (step S46). On the other hand, when the output data RMW_D does not correspond to the expected value EXP (step S45: No), the comparator 52 outputs "1" indicating "failure" as the flag signal ERR_FLG (step S47).

As described above, the data processing device according to the present embodiment diagnoses a failure of the read-modify-write circuit 32 by storing the self-diagnosis data used for the self-diagnosis in the self-diagnosis data area 73 in the memory 70, performing the read-modify-write process by using the self-diagnosis data stored in the self-diagnosis data area 73 and the modify data, and comparing the output data after performing the read-modify-write process with an expected value by the determination unit.

Therefore, it is possible to improve the reliability of the self-diagnosis of the read-modify-write circuit.

Specifically, in the data processing device according to the present embodiment, the self-diagnosis data area 73 separated from the normal data area 72 is provided in the memory 70 and the access to the self-diagnosis data area 73 is limited by using the enable signal generation circuit 68, so that even when there is a plurality of masters that access the memory 70, it is possible to perform the self-diagnosis of the read-modify-write circuit 32 without being affected by the accesses from other masters (DMAC 2 and CPU 3 in FIG. 1). In other words, it is possible to prevent the diagnosis data (output data RMW_D) from being altered by the accesses from other masters. In the data processing device according to the present embodiment, it is possible to perform the self-diagnosis of the read-modify-write circuit without duplicating the read-modify-write circuit.

In the present embodiment, a case in which the self-diagnosis data SC_D is outputted from the CPU 10' and written to the self-diagnosis data area 73 in the memory 70 (step S41 in FIG. 17) has been described. However, the self-diagnosis data SC_D may be stored in the self-diagnosis data area 73 in the memory 70 in advance. In this case, step S41 in FIG. 17 may be omitted.

The invention according to the present embodiment described above can provide a data processing device and a self-diagnosis method of the data processing device which can improve the reliability of the self-diagnosis of the read-modify-write circuit.

Fifth Embodiment

Figure 18:
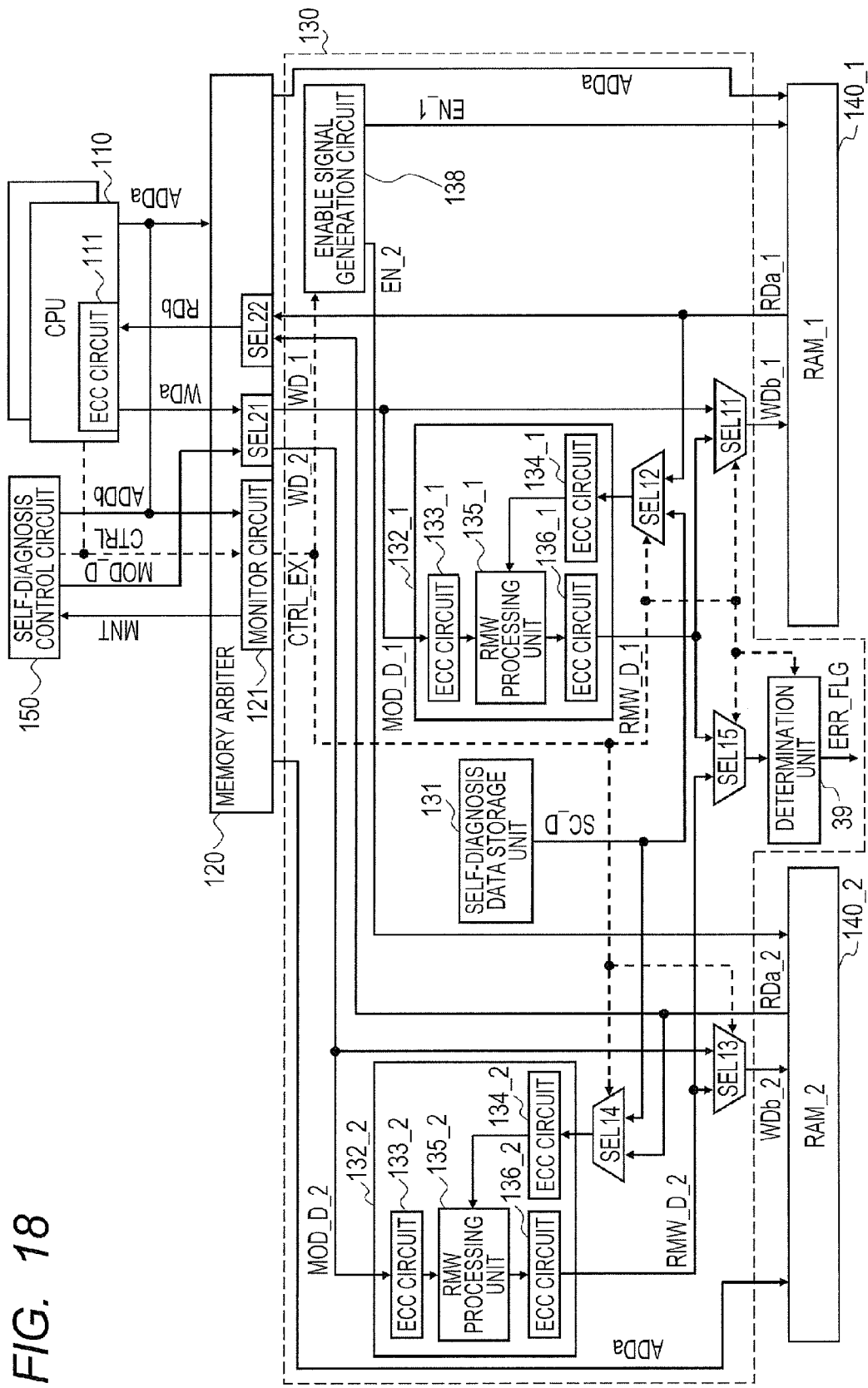
FIG. 18 is a block diagram showing a data processing device according to a fifth embodiment.

Next, a fifth embodiment of the present invention will be described. FIG. 18 is a block diagram showing the data processing device according to the present embodiment. As shown in FIG. 18, the data processing device according to the present embodiment includes a CPU (arithmetic circuit) 110, a memory arbiter 120, an access control circuit 130, memories 140_1 and 140_2, and a self-diagnosis control circuit 150. The CPU 110, the memory arbiter 120, the access control circuit 130, the memories 140_1 and 140_2, and the self-diagnosis control circuit 150 included in the data processing device are provided with a common clock signal CLK from a clock generation circuit.

The CPU 110 executes a predetermined program. The program executed by the CPU 110 is stored, for example, in the flash memory 4 shown in FIG. 1. In this case, the CPU 110 reads the program from the flash memory 4 and performs various processes according to the read program. The CPU 110 accesses the memories 140_1 and 140_2 according to the executed program. When the CPU 110 accesses the memories 140_1 and 140_2, the CPU 10 outputs an access control signal CTRL that controls the access to the memories 140_1 and 140_2. The access control signal CTRL is a signal to control the access control circuit 130. The relationship between the access control signal CTRL outputted from the CPU 110 and the process of the access control circuit 130 is the same as that shown in FIG. 3.

When the CPU 110 accesses the memories 140_1 and 140_2, the CPU 10 outputs an address signal ADDa and write data WDa. Here, the access control signal CTRL, the address signal ADDa, and the write data WDa outputted from the CPU 110 are outputted to the access control circuit 130 through the memory arbiter 120. Read data RDa_1 and RDa_2 outputted from the access control circuit 130 are supplied to the CPU 110 through the memory arbiter 120.

The CPU 110 includes an ECC circuit 111. The ECC circuit 111 includes an ECC encoder and an ECC decoder. The ECC encoder generates an error correcting code ECC for the write data WDa and adds the generated error correcting code ECC to the write data WDa. The ECC decoder detects an error of the read data RDb and corrects the read data RDb by using an error correcting code ECC included in the read data RDb.

When there is a plurality of masters that access the memories 140_1 and 140_2, that is, when there are masters other than the CPU 110 (for example, DMAC 2 and CPU 3 shown in FIG. 1) that access the memories 140_1 and 140_2, the memory arbiter 120 arbitrates access requests from each master to the memories 140_1 and 140_2 and access requests from the memories 140_1 and 140_2 (access control circuit 130) to each master.

The memory arbiter 120 includes a monitor circuit 121 and selectors SEL21 and SEL22. The access control signal CTRL and the address signal ADDa outputted from the CPU 110 are inputted into the monitor circuit 121 and the monitor circuit 121 outputs a monitor signal MNT to the self-diagnosis control circuit 150. Specifically, the monitor circuit 121 monitors whether or not the access control signal CTRL is a signal indicating the RMW process and whether the address signal ADDa is an address of the memory 140_1 or the memory 140_2. When the access control signal CTRL is a signal indicating the RMW process, the monitor circuit 121 outputs information related to a fact that the RMW process is performed and a memory (140_1 or 140_2) where the RMW process is performed to the self-diagnosis control circuit 150 as the monitor signal MNT. The monitor circuit 121 generates an extended control signal CTRL_EX, which is an extended access control signal CTRL, according to the access control signal CTRL and the address signal ADDa.

The write data WDa outputted from the CPU 110 and modify data MOD_D (for self-diagnosis) outputted from the self-diagnosis control circuit 150 are inputted into the selector SEL21 and the selector SEL21 outputs one of these as write data WD_1 of the memory 140_1 or the write data WD_2 of the memory 140_2. Read data RDa_1 outputted from the memory 140_1 and read data RDa_2 outputted from the memory 140_2 are inputted into the selector SEL22 and the selector SEL22 outputs one of these to the CPU 110. The selector SEL21 and the selector SEL22 are controlled by using a control circuit (not shown in the drawings) included in the memory arbiter 120.

The self-diagnosis control circuit 150 is a circuit that controls execution of the self-diagnosis of the RMW circuits 132_1 and 132_2. The monitor signal MNT outputted from the monitor circuit 121 is inputted into the self-diagnosis control circuit 150. When the information related to a fact that the RMW process has been performed and a memory where the RMW process has been performed is supplied to the self-diagnosis control circuit 150 as the monitor signal MNT, the self-diagnosis control circuit 150 outputs the access control signal CTRL "110" that commands the self-diagnosis and the address signal ADDb of the RMW circuit (RAM_1 or RAM_2) on which the self-diagnosis is performed to the monitor circuit 121. At this time, the self-diagnosis control circuit 150 outputs the modify data MOD_D (for self-diagnosis) to the selector SEL21.

The memory 140_1 stores the write data WDb_1 outputted from the access control circuit 130 and outputs the read data RDa_1 to the access control circuit 130. At this time, the memory 140_1 stores an error correcting code ECC added to the write data WDb_1 in association with the write data WDb_1. When the memory 140_1 receives a read instruction from the CPU 110, the memory 140_1 outputs the read data RDa_1 and an error correcting code ECC associated with the read data RDa_1.

Similarly, the memory 140_2 stores the write data WDb_2 outputted from the access control circuit 130 and outputs the read data RDa_2 to the access control circuit 130. At this time, the memory 140_2 stores an error correcting code ECC added to the write data WDb_2 in association with the write data WDb_2. When the memory 140_2 receives a read instruction from the CPU 110, the memory 140_2 outputs the read data RDa_2 and an error correcting code ECC associated with the read data RDa_2.

The extended control signal CTRL_EX, the address signal ADDa, and the write data WDa outputted from the memory arbiter 120 are inputted into the access control circuit 130 and the access control circuit 130 outputs the read data RDa_1 and RDa_2 to the CPU 110 through the memory arbiter 120. The access control circuit 130 writes the write data WDb_1 to the memory 140_1 and reads the read data RDa_1 from the memory 140_1. Also, the access control circuit 130 writes the write data WDb_2 to the memory 140_2 and reads the read data RDa_2 from the memory 140_2. In summary, the access control circuit 130 controls transmission and reception of data performed between the CPU 110 and the memories 140_1 and 140_2 on the basis of the extended control signal CTRL_EX outputted from the memory arbiter 120.

FIG. 19 is a table showing a relationship between the extended control signal CTRL_EX and the process of the access control circuit 130. When the access control signal CTRL is "000" and the address signal ADDa is an address of the memory 140_1 (RAM_1), the monitor circuit 121 outputs "000" as the extended control signal CTRL_EX (3-bit signal). When the extended control signal CTRL_EX is "000", the access control circuit 130 performs a process to read the read data RDa_1 from the memory 140_1 (RAM_1). When the access control signal CTRL is "001" and the address signal ADDa is the address of the memory 140_1 (RAM_1), the monitor circuit 121 outputs "001" as the extended control signal CTRL_EX. When the extended control signal CTRL_EX is "001", the access control circuit 130 performs a process to write the write data WDb_1 outputted from the CPU 110 to the memory 140_1 (RAM_1). When the access control signal CTRL is "010" and the address signal ADDa is the address of the memory 140_1 (RAM_1), the monitor circuit 121 outputs "010" as the extended control signal CTRL_EX. When the extended control signal CTRL_EX is "010", the access control circuit 130 performs the RMW process. When the access control signal CTRL outputted from the self-diagnosis control circuit 150 is "110" and the address signal ADDb indicates the memory 140_1 (RAM_1), the monitor circuit 121 outputs "011" as the extended control signal CTRL_EX. When the extended control signal CTRL_EX is "011", the access control circuit 130 performs the self-diagnosis of the RMW circuit 132_1.

When the access control signal CTRL is "000" and the address signal ADDa is an address of the memory 140_2 (RAM_2), the monitor circuit 121 outputs "100" as the extended control signal CTRL_EX. When the extended control signal CTRL_EX is "100", the access control circuit 130 performs a process to read the read data RDa_2 from the memory 140_2 (RAM_2). When the access control signal CTRL is "001" and the address signal ADDa is the address of the memory 140_2 (RAM_2), the monitor circuit 121 outputs "101" as the extended control signal CTRL_EX. When the extended control signal CTRL_EX is "101", the access control circuit 130 performs a process to write the write data WDb_2 outputted from the CPU 110 to the memory 140_2 (RAM_2). When the access control signal CTRL is "010" and the address signal ADDa is the address of the memory 140_2 (RAM_2), the monitor circuit 121 outputs "110" as the extended control signal CTRL_EX. When the extended control signal CTRL_EX is "110", the access control circuit 130 performs the RMW process. When the access control signal CTRL outputted from the self-diagnosis control circuit 150 is "110" and the address signal ADDb indicates the memory 140_2 (RAM_2), the monitor circuit 121 outputs "111" as the extended control signal CTRL_EX. When the extended control signal CTRL_EX is "111", the access control circuit 130 performs the self-diagnosis of the RMW circuit 132_2.

The access control circuit 130 includes a self-diagnosis data storage unit (first data storage unit) 131, RMW circuits 132_1 and 132_2, an enable signal generation circuit 138, a determination unit 39, and selectors SEL11 to SEL15.

The self-diagnosis data storage unit 131 stores in advance the self-diagnosis data SC_D (first data) used when the self-diagnosis is performed. The self-diagnosis data storage unit 131 outputs the self-diagnosis data SC_D to the selectors SEL12 and SEL14. For example, the self-diagnosis data storage unit 131 includes a register and can store the self-diagnosis data SC_D in the register.

The RMW circuits 132_1 and 132_2 are circuits to perform the read-modify-write process. The RMW circuit 132_1 includes ECC circuits 133_1, 134_1, and 136_1 and an RMW processing unit 135_1. The ECC circuits 133_1 and 134_1 are ECC decoders. The ECC circuit 133_1 detects and corrects an error of modify data MOD_D_1 by using an error correcting code ECC included in the modify data MOD_D_1 outputted from the CPU 110. The ECC circuit 134_1 detects and corrects an error of the self-diagnosis data SC_D or the read data RDa_1 outputted from the selector SEL12 by using an error correcting code ECC included in these data (SC_D or RDa_1).

The RMW processing unit 135_1 modifies a part of the self-diagnosis data SC_D or the read data RDa_1, which are selected by the selector SEL12 and processed by the ECC circuit 134_1, on the basis of the modify data MOD_D_1 processed by the ECC circuit 133_1 and outputs the modified data (output data) RMW_D_1 to the ECC circuit 136_1. The ECC circuit 136_1 is an ECC encoder, which generates an error correcting code ECC for the output data RMW_D_1 after the RMW process and adds the generated error correcting code ECC to the output data RMW_D_1. The output data RMW_D_1 processed by the ECC circuit 136_1 is outputted to the selector SEL11 and selector SEL15.

When the extended control signal CTRL_EX indicates a normal read-modify-write process (extended control signal CTRL_EX="010"), the RMW circuit 132_1 performs the read-modify-write process by replacing a part of the read data RDa_1 read from the memory 140_1 with the modify data MOD_D_1. Here, the read data RDa_1 read from the memory 140_1 is selected by the selector SEL12 and supplied to the RMW circuit 132_1.

When the extended control signal CTRL_EX indicates a self-diagnosis command of the RMW circuit 132_1 (extended control signal CTRL_EX="111"), the RMW circuit 132_1 performs the read-modify-write process by replacing a part of the self-diagnosis data SC_D outputted from the self-diagnosis data storage unit 131 with the modify data MOD_D__1.

The RMW circuit 132_2 includes ECC circuits 133_2, 134_2, and 136_2 and an RMW processing unit 135_2. Since the configuration and the operation of the RMW circuit 132_2 is the same as those of the RMW circuit 132_1, redundant description will be omitted.

When the extended control signal CTRL_EX is a signal indicating the self-diagnosis command ("011" or "111"), the enable signal generation circuit 138 outputs signals indicating an inactive state (for example, a low level signal "0") to the memories 140_1 and 140_2 as enable signals EN__1 and EN__2 respectively. When the CPU 110 accesses the memories 140_1 and 140_2, the CPU 110 outputs the address signal ADDa to the memories 140_1 and 140_2 through the memory arbiter 120. However, if the enable signal EN__1 of low level is supplied to the memory 140_1, the memory 140_1 invalidates the supplied address signal ADDa. In the same manner, if the enable signal EN__2 of low level is supplied to the memory 140_2, the memory 140_2 invalidates the supplied address signal ADDa. In this way, when the self-diagnosis is performed, if the enable signal generation circuit 138 outputs the enable signals EN__1 and EN__2 of low level, it is possible to invalidate the accesses from the CPU 110 to the memories 140_1 and 140_2 during the self-diagnosis.

On the other hand, when the access control signal CTRL indicates reading of read data "000" or "100", writing of write data "001" or "101", or execution of RMW process "010" or "110", the enable signal generation circuit 138 outputs signals indicating an active state (for example, high level signals "1") to the memories 140_1 and 140_2 as the enable signals EN__1 and EN__2. In this case, the enable signals EN__1 and EN__2 are high level, so that the address signal ADDa supplied to the memories 140_1 and 140_2 is recognized as valid.

The selector SEL11 selects either one of the output data RMW_D__1 and the write data WD__1 according to the extended control signal CTRL_EX and outputs the selected data as the write data WDb__1.

The selector SEL12 selects either one of the self-diagnosis data SC_D outputted from the self-diagnosis data storage unit 131 and the read data RDa__1 according to the extended control signal CTRL_EX and outputs the selected data to the RMW circuit 132_1.

The selector SEL13 selects either one of the output data RMW_D__2 and the write data WD__2 according to the extended control signal CTRL_EX and outputs the selected data as the write data WDb__2.

The selector SEL14 selects either one of the self-diagnosis data SC_D outputted from the self-diagnosis data storage unit 131 and the read data RDa__2 according to the extended control signal CTRL_EX and outputs the selected data to the RMW circuit 132_2.

The selector SEL15 selects either one of the output data RMW_D__1 and the output data RMW_D__2 according to the extended control signal CTRL_EX and outputs the selected data to the determination unit 39.

The determination unit 39 diagnoses a failure of the RMW circuits 132_1 and 132_2 by comparing the output data (RMW_D__1 or RMW_D__2) outputted from the selector SEL15 with an expected value stored in the determination unit 39 in advance. The configuration and the operation of the determination unit 39 are the same as those of the determination unit 39 shown in FIG. 12.

Next, an operation of the data processing device according to the present embodiment will be described.

First, a normal operation will be described. When the CPU 110 reads read data from the memory 140_2, the CPU 110 outputs the access control signal CTRL "000". Also, the CPU 110 outputs an address ADD_rd__2 of the memory 140_2 in which the read data is stored as the address signal ADDa. Since the access control signal CTRL is "000" and the address signal ADDa is the address ADD_rd__2 of the memory 140_2, the monitor circuit 121 outputs "100" as the extended control signal CTRL_EX. At this time, the enable signal generation circuit 138 outputs the enable signal EN__2 of high level to the memory 140_2. Since the enable signal EN is high level, the memory 140_2 outputs the read data RDa__2 (including an error correcting code ECC) according to the address ADD_rd__2 to the selector SEL22. The selector SEL22 selects the read data RDa__2 and outputs the read data RDa__2 to the CPU 110 as the read data RDb. Here, the read data RDb is data selected by the selector SEL22 and the read data RDb is the same as the read data RDa__2.

When the CPU 110 writes write data to the memory 140_2, the CPU 110 outputs the access control signal CTRL "001" and the write data WDa (including an error correcting code ECC). Also, the CPU 110 outputs an address ADD_wr__2 of the write destination of the write data as the address signal ADDa. Since the access control signal CTRL is "001" and the address signal ADDa is the address ADD_wr__2 of the memory 140_2, the monitor circuit 121 outputs "101" as the extended control signal CTRL_EX. At this time, the enable signal generation circuit 138 outputs the enable signal EN__2 of high level to the memory 140_2. The write data WDa outputted from the CPU 110 is selected by the selector SEL21 and the selector SEL13 and outputted to the memory 140_2 as the write data WDb__2. Here, the write data WDb__2 is data selected by the selector SEL13 and the write data WDb__2 is the same as the write data WDa. Since the enable signal EN__2 is high level, in the memory 140_2, the write data WDb__2 (including an error correcting code ECC) is written to an address corresponding to the address ADD_wr__2.

When the CPU 110 performs the RMW process, the CPU 110 outputs the access control signal CTRL "010". Also, the CPU 110 outputs the modify data MOD_D__2 (including an error correcting code ECC) as the write data WDa and outputs an address ADD_rmw__2, at which data to be processed in the RMW process is stored, as the address signal ADDa. Since the access control signal CTRL is "010" and the address signal ADDa is the address ADD_rmw__2 of the memory 140_2, the monitor circuit 121 outputs "110" as the extended control signal CTRL_EX. At this time, the enable signal generation circuit 138 outputs the enable signal EN__2 of high level to the memory 140_2. Since the enable signal EN__2 is high level, the memory 140_2 outputs the read data RDa__2 (including an error correcting code ECC) according to the address ADD_rmw__2 to the selector SEL14. Since the extended control signal CTRL_EX is "110", the selector SEL14 selects the read data RDa__2 and outputs the read data RDa__2 to the RMW circuit 132_2. The RMW circuit 132_2 modifies a part of the read data RDa__2 on the basis of the modify data MOD_D__2 and outputs the modified data (output data) RMW_D__2. Since the extended control signal CTRL_EX is "110", the selector SEL13 selects the output data RMW_D__2 of the RMW circuit 132_2 and outputs the selected output data RMW_D__2 to the memory 140_2. Since the enable signal EN__2 is high level, in the memory 140_2, the output data RMW_D_2 (including an error correcting code ECC) is written to an address corresponding to the address ADD_rmw_2.

The operations in which the CPU 110 reads the read data from the memory 140_1, the CPU 110 writes the write data to the memory 140_1, and the CPU 110 performs the RMW process on the data stored in the memory 140_1 are basically the same as the operations described above.

Next, an operation in the self-diagnosis of the data processing device according to the present embodiment will be described.

Figure 20:
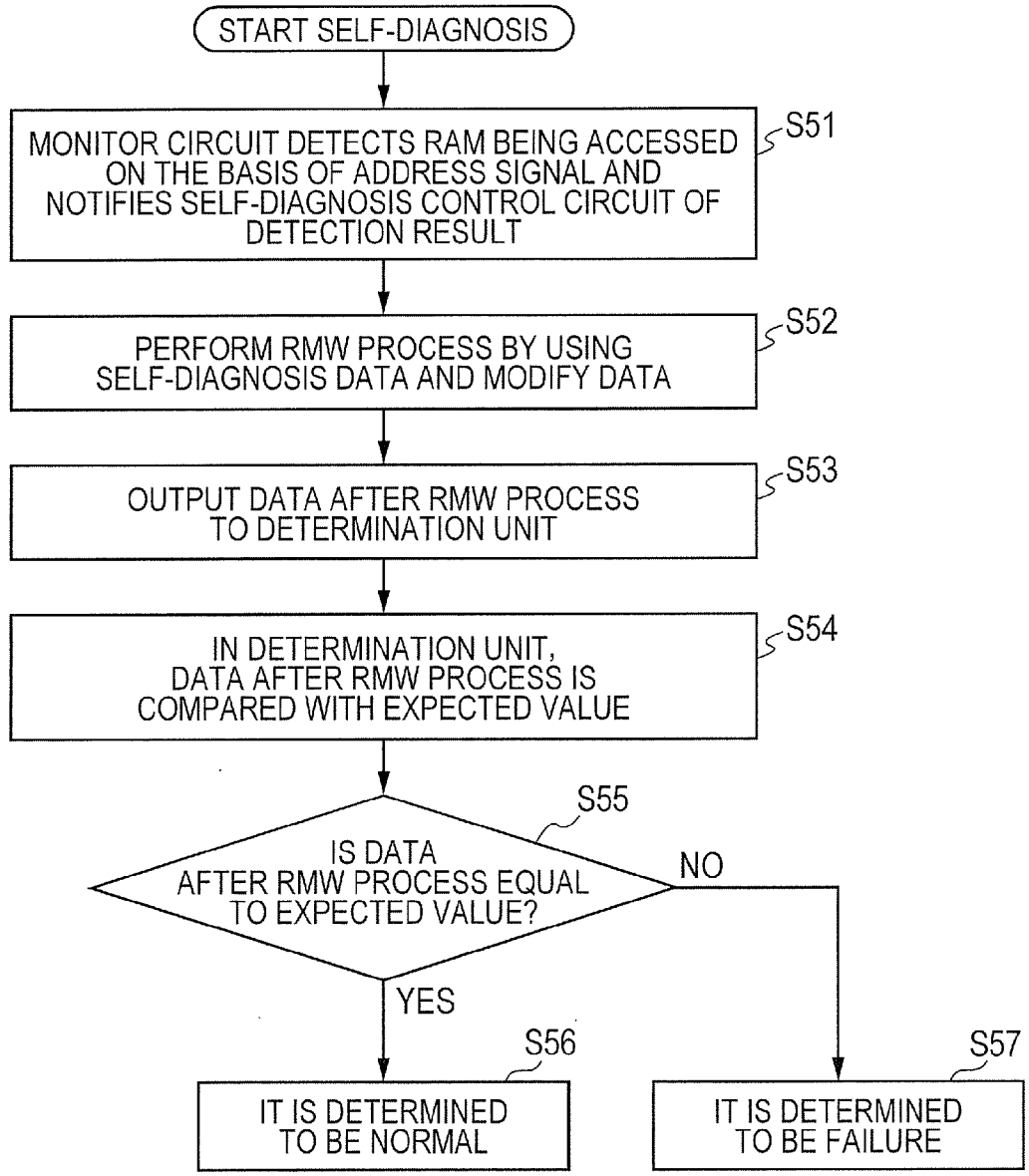
FIG. 20 is a flowchart for explaining an operation in self-diagnosis of the data processing device according to the fifth embodiment.

FIG. 20 is a flowchart for explaining the operation of the self-diagnosis of the data processing device according to the present embodiment. When a signal ("010") that commands a normal RMW process is outputted from the CPU 110 as the access control signal CTRL, the monitor circuit 121 notifies the self-diagnosis control circuit 150 whether the address signal ADDa outputted from the CPU 110 is an address of the memory 140_1 or the memory 140_2 (step S51).

When the monitor signal MNT that indicates a fact that the RMW process has been performed and the address of the memory where the RMW process has been performed is supplied to the self-diagnosis control circuit 150, the self-diagnosis control circuit 150 outputs the access control signal CTRL "110" that commands the self-diagnosis and the address signal ADDb of the RMW circuit on which the self-diagnosis is performed to the monitor circuit 121. At this time, the self-diagnosis control circuit 150 outputs the modify data MOD_D (for self-diagnosis) to the selector SEL21. Thereby, the self-diagnosis of the RMW circuit (132_1 or 132_2) is performed (step S52).

Thereafter, the RMW circuit (132_1 or 132_2) outputs the output data (RMW_D_1 or RMW_D_2) after the RMW process to the determination unit 39 (step S53). Then, the determination unit 39 compares the output data (RMW_D_1 or RMW_D_2) with an expected value (step S54). When the output data (RMW_D_1 or RMW_D_2) corresponds to the expected value (step S55: Yes), it is determined that the RMW circuit is normal (step S56). On the other hand, when the output data (RMW_D_1 or RMW_D_2) does not correspond to the expected value (step S55: No), it is determined that the RMW circuit fails (step S57).

Figure 21:
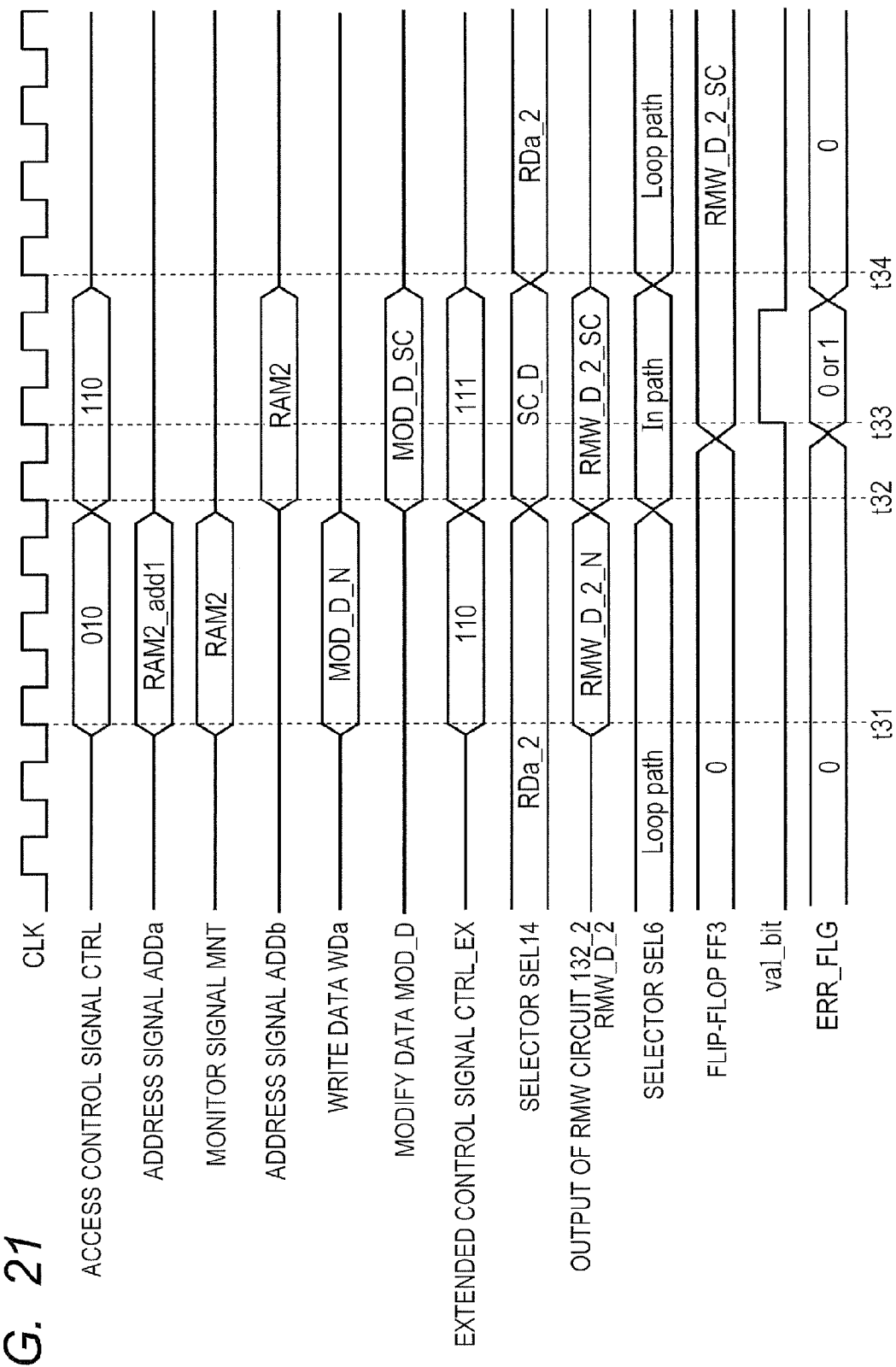
FIG. 21 is a timing chart for explaining the self-diagnosis operation of the data processing device according to the fifth embodiment.

Next, an operation in the self-diagnosis of the data processing device according to the present embodiment will be described in detail with reference to a timing chart shown in FIG. 21. First, at timing t31, the CPU 110 outputs a signal ("010") that commands a normal RMW process as the access control signal CTRL and outputs an address RAM2_add1 of the memory 140_2 as the address signal ADDa. Also, the CPU 110 outputs modify data MOD_D_N used in a normal RMW process as the write data WDa.

Since the access control signal CTRL "010" and the address RAM2_add1 of the memory 140_2 are outputted from the CPU 110, the monitor circuit 121 outputs the monitor signal MNT to the self-diagnosis control circuit 150. At this time, the monitor signal MNT includes information (RAM2) related to the address signal ADDa outputted from the CPU 110.

Since the access control signal CTRL is "010" and the address signal ADDa is the address of the memory 140_2, the monitor circuit 121 outputs "110" (RMW process command) as the extended control signal CTRL_EX. At this time, the enable signal generation circuit 138 outputs the enable signal EN_2 of high level to the memory 140_2. Since the enable signal EN_2 is high level, the memory 140_2 outputs the read data RDa_2 according to the address RAM2_add1 to the selector SEL14. Since the extended control signal CTR-L_EX is "110", the selector SEL14 selects the read data RDa_2 and outputs the read data RDa_2 to the RMW circuit 132_2. The RMW circuit 132_2 modifies a part of the read data RDa_2 on the basis of the modify data MOD_D_N and outputs the modified data (output data) RMW_D_2_N. Since the extended control signal CTRL_EX is "110", the selector SEL13 selects the output data RMW_D_2_N of the RMW circuit 132_2 and outputs the selected output data RMW_D_2_N to the memory 140_2. Since the enable signal EN_2 is high level, in the memory 140_2, the output data RMW_D_2_N is written to an address corresponding to the address RAM2_add1.

At timing t31, the monitor signal MNT including information that indicates a fact that the RMW process has been performed and the memory where the RMW process has been performed is supplied to the self-diagnosis control circuit 150. Therefore, at timing t32, the self-diagnosis control circuit 150 outputs "110" as the access control signal CTRL that commands the self-diagnosis and "RAM2" as the address signal ADDb related to the RMW circuit on which the self-diagnosis is performed to the monitor circuit 121. At this time, the self-diagnosis control circuit 150 outputs "MOD_D_SC" as the modify data MOD_D. Since the access control signal CTRL is "110" and the address signal ADDb is the address of the memory 140_2, the monitor circuit 121 outputs "111" (self-diagnosis command of the RMW circuit) as the extended control signal CTRL_EX. At this time, since the extended control signal CTRL_EX is a signal that indicates the self-diagnosis command, the enable signal generation circuit 138 outputs a low-level signal to the memory 140_2 as the enable signal EN_2. When the enable signal EN_2 of low level is supplied to the memory 140_2, the memory 140_2 invalidates the supplied address signal ADDa. Thereby, it is possible to invalidate the access from the CPU 110 to the memory 140_2 during the self-diagnosis.

At the timing t32, the selector SEL14 selects the self-diagnosis data SC_D outputted from the self-diagnosis data storage unit 131. Therefore, the self-diagnosis data SC_D is supplied to the RMW circuit 132_2. Since the selector SEL21 selects the modify data MOD_D_SC, the modify data MOD_D_SC is supplied to the RMW circuit 132_2. The RMW circuit 132_2 modifies a part of the self-diagnosis data SC_D on the basis of the modify data MOD_D_SC and outputs the modified data (output data) RMW_D_2_SC. At this time, the selector SEL15 selects the output data RMW_D_2_SC of the RMW circuit 132_2 and outputs the output data RMW_D_2_SC to the determination unit 39.

At the timing t32, the selector SEL6 (see FIG. 12) in the determination unit 39 selects an input path. Therefore, at timing t33, the output data RMW_D_2_SC is stored in the flip-flop FF3 in the determination unit 39. Also, at the timing t33, the valid bit val_bit "1" is outputted and the output data RMW_D_2_SC is compared with the expected value EXP by the comparator 52. When the output data RMW_D_2_SC corresponds to the expected value EXP, the comparator 52 outputs "0" as an error flag ERR_FLG. On the other hand, when the output data RMW_D_2_SC does not correspond to the expected value EXP, the comparator 52 outputs "1" as an error flag ERR_FLG. Thereafter, at timing t34, the access control signal becomes other than "110", so that the self-diagnosis process is finished.

As described above, the data processing device according to the present embodiment diagnoses a failure of the read-modify-write circuits 132_1 and 132_2 by storing the self-diagnosis data used for the self-diagnosis in the self-diagnosis data storage unit 131, performing the read-modify-write process by using the self-diagnosis data stored in the self-diagnosis data storage unit 131 and the modify data, and comparing the output data after performing the read-modify-write process with an expected value by the determination unit 39.

Therefore, it is possible to improve the reliability of the self-diagnosis of the read-modify-write circuits. Also, it is possible to perform the self-diagnosis of the read-modify-write circuits without duplicating the read-modify-write circuits. Further, the data processing device according to the present embodiment includes the monitor circuit 121 that monitors the access control signal CTRL outputted from the CPU 110 and the self-diagnosis control circuit 150 that controls the self-diagnosis according to the monitoring result of the monitor circuit 121, so that it is possible to automatically perform the self-diagnosis of the RMW circuits 132_1 and 132_2 when a normal RMW process is performed. Furthermore, in the data processing device according to the present embodiment, the monitor circuit 121 generates the extended control signal CTRL_EX. Therefore, even when the data processing device includes the plurality of memories 140_1 and 140_2, it is possible to perform the self-diagnosis of the RMW circuits 132_1 and 132_2 without providing a complicated circuit. In the description of the data processing device according to the present embodiment, the data processing device includes two memories 140_1 and 140_2. However, the data processing device may include three or more memories.

The invention according to the present embodiment described above can provide a data processing device and a self-diagnosis method of the data processing device which can improve the reliability of the self-diagnosis of the read-modify-write circuits.

Sixth Embodiment

Figure 22:
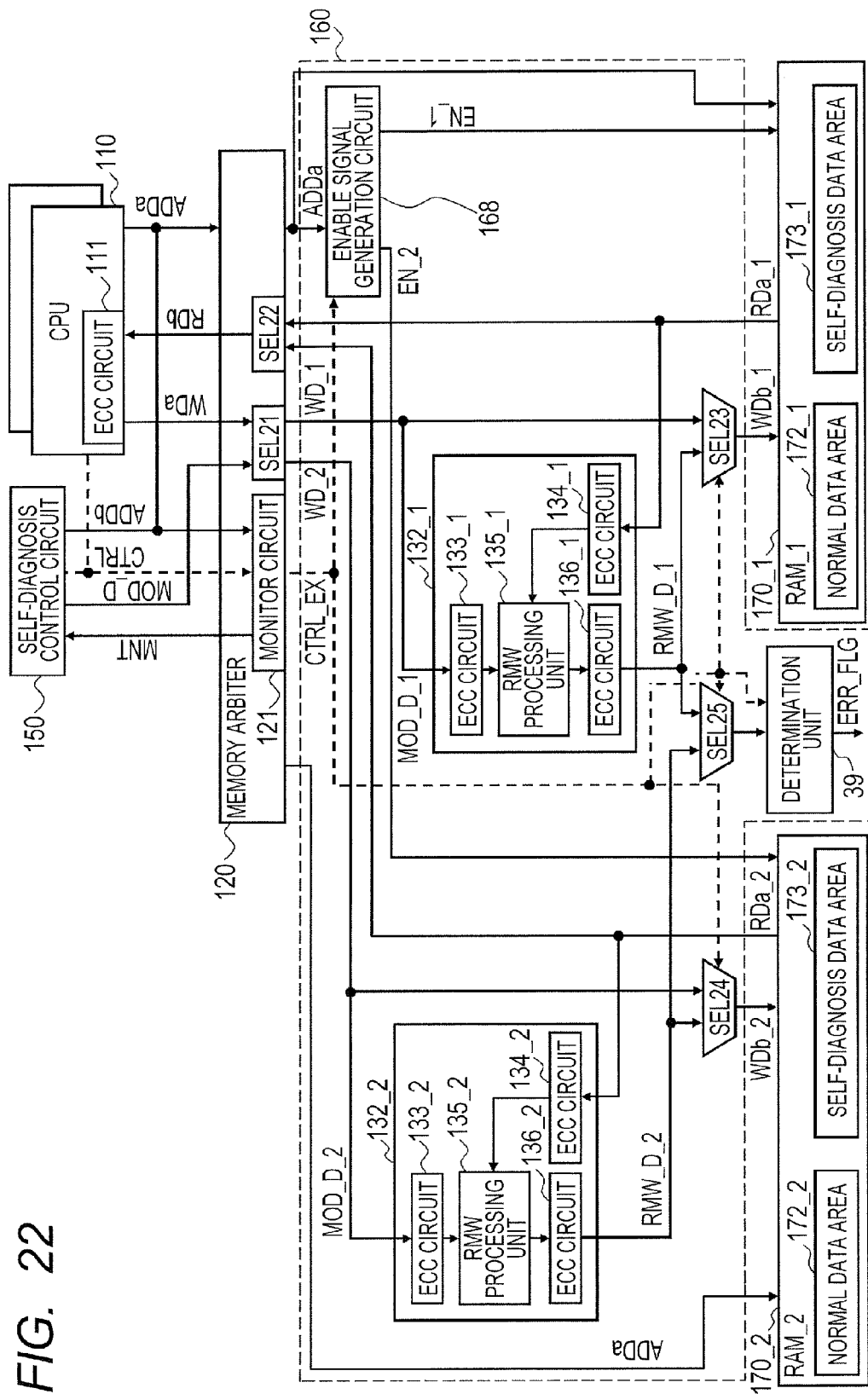
FIG. 22 is a block diagram showing a data processing device according to a sixth embodiment.

Next, a sixth embodiment of the present invention will be described. FIG. 22 is a block diagram showing the data processing device according to the present embodiment. As shown in FIG. 22, the data processing device according to the present embodiment includes a CPU 110, a memory arbiter 120, an access control circuit 160, memories 170_1 and 170_2, and a self-diagnosis control circuit 150. The CPU 110, the memory arbiter 120, the access control circuit 160, the memories 170_1 and 170_2, and the self-diagnosis control circuit 150 included in the data processing device are provided with a common clock signal CLK from a clock generation circuit.

The data processing device according to the present embodiment has a configuration in which the data processing device according to the third embodiment (see FIG. 14) and the data processing device according to the fifth embodiment (see FIG. 18) are combined. The CPU 110, the memory arbiter 120, and the self-diagnosis control circuit 150 are the same as those included in the data processing device according to the fifth embodiment (see FIG. 18), so that redundant description will be omitted. The memories 170_1 and 170_2 are the same as those included in the data processing device according to the third embodiment (see FIG. 14), so that redundant description will be omitted.

The extended control signal CTRL_EX, the address signal ADDa, and the write data WDa outputted from the memory arbiter 120 are inputted into the access control circuit 160 and the access control circuit 160 outputs the read data RDa__1 and RDa__2 to the CPU 110 through the memory arbiter 120. The access control circuit 160 writes the write data WDb__1 to the memory 170_1 and reads the read data RDa__1 from the memory 170_1. Also, the access control circuit 160 writes the write data WDb__2 to the memory 170_2 and reads the read data RDa__2 from the memory 170_2. In summary, the access control circuit 160 controls transmission and reception of data performed between the CPU 110 and the memories 170_1 and 170_2 on the basis of the extended control signal CTRL_EX outputted from the memory arbiter 120.

The access control circuit 160 includes RMW circuits 132_1 and 132_2, an enable signal generation circuit 168, and selectors SEL23 to SEL25. The RMW circuits 132_1 and 132_2 are the same as those included in the data processing device according to the fifth embodiment, so that redundant description will be omitted.

The enable signal generation circuit 168 generates enable signals EN__1 and EN__2 that validates/invalidates accesses to the memories 170_1 and 170_2 according to the extended control signal CTRL_EX and the address signal ADDa. Specifically, when the extended control signal CTRL_EX is an extended control signal CTRL_EX that indicates the self-diagnosis command (that is, the extended control signal CTRL_EX is "011" or "111") and the address signal ADDa is an address corresponding to the self-diagnosis data area 173_1 or 173_2 in the memory 170_1 or 170_2, the enable signal generation circuit 168 outputs the enable signal EN__1 or EN__2 of high level to the memory 170_1 or 170_2. For example, when the enable signal EN__1 is high level, the address signal ADDa supplied to the memory 170_1 is recognized as valid. As a result, the access to the self-diagnosis data area 173_1 in the memory 170_1 is allowed. For example, when the enable signal EN__2 is high level, the address signal ADDa supplied to the memory 170_2 is recognized as valid. As a result, the access to the self-diagnosis data area 173_2 in the memory 170_2 is allowed.

On the other hand, when the extended control signal CTRL_EX is "011" or "111" and the address signal ADDa is an address corresponding to the normal data area 172_1 or 172_2 in the memory 170_1 or 170_2, the enable signal generation circuit 168 outputs the enable signal EN__1 or EN__2 of low level to the memory 170_1 or 170_2. For example, when the enable signal EN__1 is low level, the address signal ADDa supplied to the memory 170_1 is recognized as invalid. As a result, the access to the normal data area 172_1 in the memory 170_1 is prohibited. For example, when the enable signal EN__2 is low level, the address signal ADDa supplied to the memory 170_2 is recognized as invalid. As a result, the access to the normal data area 172_2 in the memory 170_2 is prohibited.

When the extended control signal CTRL_EX is an extended control signal CTRL_EX that indicates a normal access (that is, the extended control signal CTRL_EX is other than "011" or "111") and the address signal ADDa is an address corresponding to the self-diagnosis data area 173_1 or 173_2 in the memory 170_1 or 170_2, the enable signal generation circuit 168 outputs the enable signal EN__1 or EN__2 of low level to the memory 170_1 or 170_2. For example, when the enable signal EN__1 is low level, the address signal ADDa supplied to the memory 170_1 is recognized as invalid. As a result, the access to the self-diagnosis data area 173_1 in the memory 170_1 is prohibited. For example, when the enable signal EN__2 is low level, the address signal ADDa supplied to the memory 170_2 is recognized as invalid. As a result, the access to the self-diagnosis data area 173_12 in the memory 170_2 is prohibited.

On the other hand, when the extended control signal CTRL_EX is other than "011" or "111" and the address signal ADDa is an address corresponding to the normal data area 172_1 or 172_2 in the memory 170_1 or 170_2, the enable signal generation circuit 168 outputs the enable signal EN__1 or EN__2 of high level to the memory 170_1 or 170_2. For example, when the enable signal EN_1 is high level, the address signal ADDa supplied to the memory 170_1 is recognized as valid. As a result, the access to the normal data area 172_1 in the memory 170_1 is allowed. For example, when the enable signal EN_2 is high level, the address signal ADDa supplied to the memory 170_2 is recognized as valid. As a result, the access to the normal data area 172_2 in the memory 170_2 is allowed.

In the enable signal generation circuit 168, information related to the addresses corresponding to the normal data areas 172_1 and 172_2 and the addresses corresponding to the self-diagnosis data areas 173_1 and 173_2 is stored.

The selector SEL23 selects either one of the output data RMW_D_1 and the write data WD_1 according to the extended control signal CTRL_EX and outputs the selected data as the write data WDb_1. The selector SEL24 selects either one of the output data RMW_D_2 and the write data WD_2 according to the extended control signal CTRL_EX and outputs the selected data as the write data WDb_2. The selector SEL25 selects either one of the output data RMW_D_1 and the output data RMW_D_2 according to the extended control signal CTRL_EX and outputs the selected data to the determination unit 39.

Next, an operation of the data processing device according to the present embodiment will be described.

First, a normal operation will be described. When the CPU 110 reads read data from the memory 170_2, the CPU 110 outputs the access control signal CTRL "000". Also, the CPU 110 outputs an address ADD_rd_2 (address corresponding to the normal data area 172_2) of the memory 170_2 in which the read data is stored as the address signal ADDa. Since the access control signal CTRL is "000" and the address signal ADDa is the address ADD_rd_2 of the memory 170_2, the monitor circuit 121 outputs "100" as the extended control signal CTRL_EX. At this time, the extended control signal CTRL_EX is other than "011" or "111" and the address ADD_rd_2 is the address of the normal data area 172_2, so that the enable signal generation circuit 168 outputs the enable signal EN_2 of high level to the memory 170_2. Since the enable signal EN_2 is high level, the memory 170_2 recognizes the address ADD_rd_2 as valid and outputs the read data RDa_2 (including an error correcting code ECC) according to the address ADD_rd_2 to the selector SEL22. The selector SEL22 selects the read data RDa_2 and outputs the read data RDa_2 to the CPU 110 as the read data RDb. Here, the read data RDb is data selected by the selector SEL22 and the read data RDb is the same as the read data RDa_2.

When the CPU 110 writes write data to the memory 170_2, the CPU 110 outputs the access control signal CTRL "001" and the write data WDa (including an error correcting code ECC). Also, the CPU 110 outputs an address ADD_wr_2 of the write destination of the write data (address corresponding to the normal data area 172_2) as the address signal ADDa. Since the access control signal CTRL is "001" and the address signal ADDa is the address ADD_wr_2 of the memory 170_2, the monitor circuit 121 outputs "101" as the extended control signal CTRL_EX. At this time, the extended control signal CTRL_EX is other than "011" or "111" and the address ADD_wr_2 is the address of the normal data area 172_2, so that the enable signal generation circuit 168 outputs the enable signal EN_2 of high level to the memory 170_2. The write data WDa outputted from the CPU 110 is selected by the selector SEL21 and the selector SEL24 and outputted to the memory 170_2 as the write data WDb_2. Here, the write data WDb_2 is data selected by the selector SEL24 and the write data WDb_2 is the same as the write data WDa. Since the enable signal EN_2 is high level, the memory 170_2 recognizes the address ADD_wr_2 as valid and the write data WDb_2 (including an error correcting code ECC) is written to an address corresponding to the address ADD_wr_2 in the memory 170_2.

When the CPU 110 performs the RMW process, the CPU 110 outputs the access control signal CTRL "010". Also, the CPU 110 outputs the modify data MOD_D_2 (including an error correcting code ECC) as the write data WDa and outputs an address ADD_rmw_2 (address corresponding to the normal data area 172_2), at which data to be processed in the RMW process is stored, as the address signal ADDa. Since the access control signal CTRL is "010" and the address signal ADDa is the address ADD_rmw_2 of the memory 170_2, the monitor circuit 121 outputs "110" as the extended control signal CTRL_EX. At this time, the extended control signal CTRL_EX is other than "011" or "111" and the address ADD_rmw_2 is the address of the normal data area 172_2, so that the enable signal generation circuit 168 outputs the enable signal EN_2 of high level to the memory 170_2. Since the enable signal EN_2 is high level, the memory 170_2 recognizes the address ADD_rmw_2 as valid and outputs the read data RDa_2 (including an error correcting code ECC) according to the address ADD_rmw_2 to the RMW circuit 132_2. The RMW circuit 132_2 modifies a part of the read data RDa_2 on the basis of the modify data MOD_D_2 and outputs the modified data (output data) RMW_D_2. Since the extended control signal CTRL_EX is "110", the selector SEL24 selects the output data RMW_D_2 of the RMW circuit 132_2 and outputs the selected output data RMW_D_2 to the memory 170_2. In the memory 170_2, the output data RMW_D_2 (including an error correcting code ECC) is written to an address corresponding to the address ADD_rmw_2.

Next, an operation in the self-diagnosis of the data processing device according to the present embodiment will be described.

Figure 23:
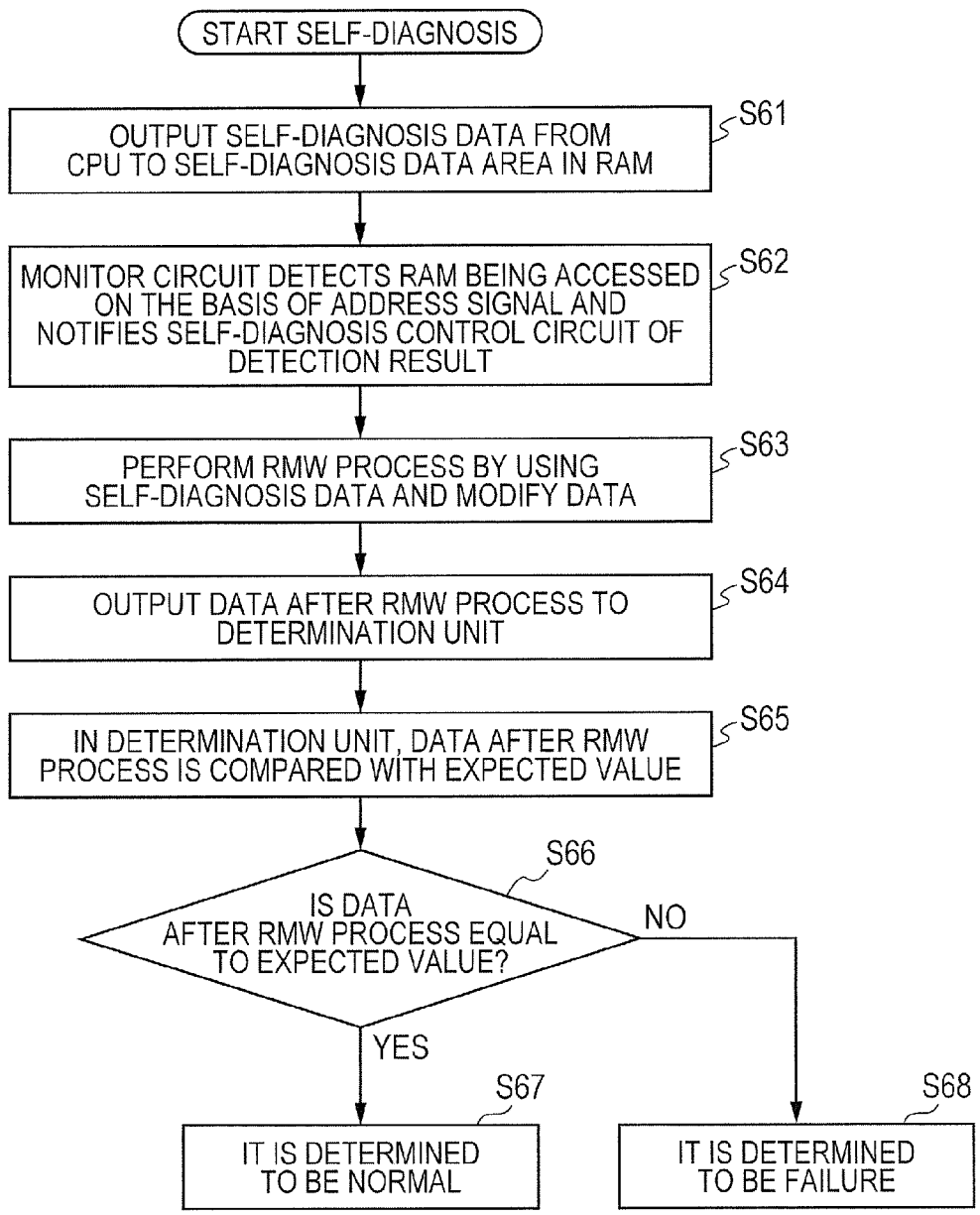
FIG. 23 is a flowchart for explaining an operation in self-diagnosis of the data processing device according to the sixth embodiment.

FIG. 23 is a flowchart for explaining the operation of the self-diagnosis of the data processing device according to the present embodiment. In the description below, an example in which the self-diagnosis is performed in the memory 170_2 will be described.

First, the CPU 110 outputs the self-diagnosis data to the self-diagnosis data area 173_2 in the memory 170_2 (step S61). At this time, the CPU 110 outputs the access control signal "101". Also, the CPU 110 outputs the self-diagnosis data SC_D as the write data WDa and outputs an address ADD_sc_2 (address corresponding to the self-diagnosis data area 173_2), at which the self-diagnosis data SC_D is stored, as the address signal ADD.

Since the access control signal CTRL is "101" and the address signal ADDa is the address ADD_sc_2 of the memory 170_2, the monitor circuit 121 outputs "1001" (4-bit signal) as the extended control signal CTRL_EX. Here, the extended control signal CTRL_EX "1001" is a control signal for writing the self-diagnosis data to the memory 170_2. The extended control signal CTRL_EX for writing the self-diagnosis data to the memory 170_1 is, for example, "1000" (4-bit signal).

At this time, the extended control signal CTRL_EX is "1001" that commands to store the self-diagnosis data and the address ADD_sc_2 is the address of the self-diagnosis data area 173_2, so that the enable signal generation circuit 168 outputs the enable signal EN_2 of high level to the memory 170_2. The self-diagnosis data SC_D outputted from the CPU 110 is selected by the selector SEL21 and the selector SEL24 and outputted to the memory 170_2. Since the enable signal EN_2 is high level, the memory 170_2 recognizes the address ADD_sc_2 as valid and the self-diagnosis data SC_D (including an error correcting code ECC) is written to an address corresponding to the address ADD_sc_2 of the self-diagnosis data area 173_2 in the memory 170_2.

When the monitor signal MNT that indicates a fact that the RMW process has been performed and the address of the memory where the RMW process has been performed is supplied to the self-diagnosis control circuit 150, the self-diagnosis control circuit 150 outputs the access control signal CTRL "110" that commands the self-diagnosis and the address signal ADDb of the RMW circuit on which the self-diagnosis is performed to the monitor circuit 121 (step S62). At this time, the self-diagnosis control circuit 150 outputs the modify data MOD_D (for self-diagnosis) to the selector SEL21. Thereby, the self-diagnosis of the RMW circuit 132_2 is performed (step S63). The self-diagnosis of the RMW circuit 132_2 is the same as that in the fifth embodiment.

Thereafter, the RMW circuit 132_2 outputs the output data RMW_D_2 after the RMW process to the determination unit 39 (step S64). Then, the determination unit 39 compares the output data RMW_D_2 with an expected value (step S65). When the output data RMW_D_2 corresponds to the expected value (step S66: Yes), it is determined that the RMW circuit 132_2 is normal (step S67). On the other hand, when the output data RMW_D_2 does not correspond to the expected value (step S66: No), it is determined that the RMW circuit 132_2 fails (step S68). The details of the process of the determination unit 39 are the same as those described in the fifth embodiment.

As described above, the data processing device according to the present embodiment diagnoses a failure of the read-modify-write circuits 132_1 and 132_2 by storing the self-diagnosis data used for the self-diagnosis in the self-diagnosis data areas 173_1 and 173_2 in the memories 170_1 and 170_2, performing the read-modify-write process by using the self-diagnosis data and the modify data, and comparing the output data after performing the read-modify-write process with an expected value by the determination unit 39.

Therefore, it is possible to improve the reliability of the self-diagnosis of the read-modify-write circuit. Also, it is possible to perform the self-diagnosis of the read-modify-write circuits without duplicating the read-modify-write circuits. Further, the data processing device according to the present embodiment includes the monitor circuit 121 that monitors the access control signal CTRL outputted from the CPU 110 and the self-diagnosis control circuit 150 that controls the self-diagnosis according to the monitoring result of the monitor circuit 121, so that it is possible to automatically perform the self-diagnosis of the RMW circuits 132_1 and 132_2 when a normal RMW process is performed. Furthermore, in the data processing device according to the present embodiment, the monitor circuit 121 generates the extended control signal CTRL_EX. Therefore, even when the data processing device includes the plurality of memories 170_1 and 170_2, it is possible to perform the self-diagnosis of the RMW circuits 132_1 and 132_2 without providing a complicated circuit. In the description of the data processing device according to the present embodiment, the data processing device includes two memories 170_1 and 170_2. However, the data processing device may include three or more memories.

In the present embodiment, a case has been described in which the self-diagnosis data SC_D is outputted from the CPU 110 and written to the self-diagnosis data areas 173_1 and 173_2 in the memories 170_1 and 170_2 (step S61 in FIG. 23). However, the self-diagnosis data SC_D may be stored in the self-diagnosis data areas 173_1 and 173_2 in the memories 170_1 and 170_2 in advance. In this case, step S61 in FIG. 23 may be omitted.

In the present embodiment, an example has been described in which the determination unit 39 determines a failure of the RMW circuits 132_1 and 132_2 by comparing the output data (RMW_D_1 or RMW_D_2) with an expected value. However, the CPU 10 may determine the failure of the RMW circuits 132_1 and 132_2. In this case, for example, in the same manner as described in the third embodiment, the output data RMW_D_1 and RMW_D_2 are temporarily stored in the self-diagnosis data areas 173_1 and 173_2 in the memories 170_1 and 170_2 and thereafter the output data RMW_D_1 and RMW_D_2 may be outputted to the CPU 110.

The invention according to the present embodiment described above can provide a data processing device and a self-diagnosis method of the data processing device which can improve the reliability of the self-diagnosis of the read-modify-write circuits.

Seventh Embodiment

Next, a seventh embodiment of the present invention will be described. In the seventh embodiment, a case will be described in which the mode control unit 5 shown in FIG. 1 switches the diagnostic mode of the data processing device. The invention according to the present embodiment can be applied to the data processing device according to the first to the sixth embodiments described above. In the description below, an example in which the invention according to the present embodiment is applied to the data processing device according to the first embodiment will be described. The data processing device according to the present embodiment is the same as that according to the first embodiment except that the mode control unit 5 switches the diagnostic mode, so that redundant description will be omitted.

Figure 24:
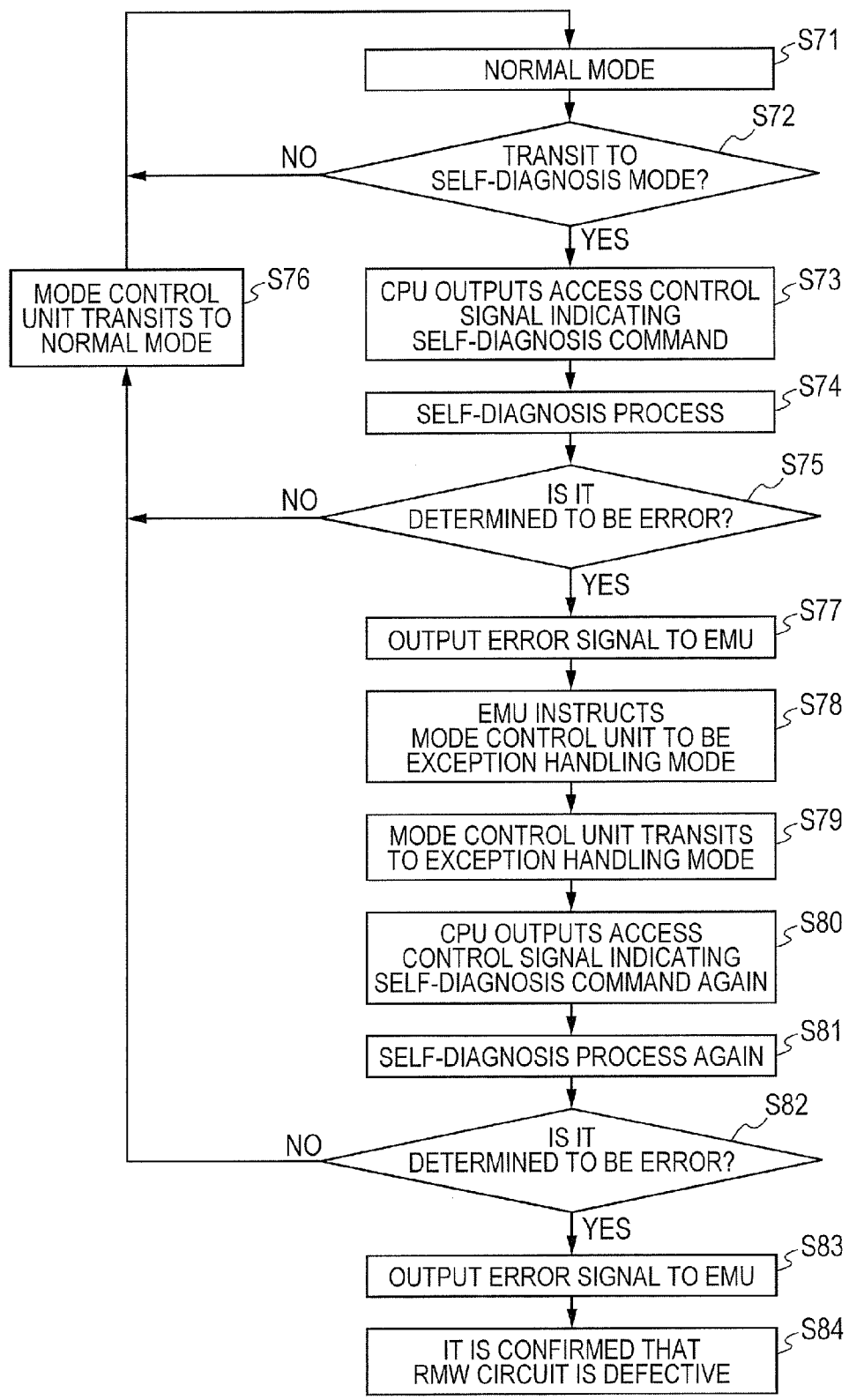
FIG. 24 is a flowchart for explaining an operation in self-diagnosis of a data processing device according to a seventh embodiment.

FIG. 24 is a flowchart for explaining an operation of the data processing device according to the present embodiment. When the diagnostic mode is a normal mode (step S71), the CPU 10 of the data processing device executes a predetermined program without performing the self-diagnosis. When the mode control unit 5 changes to the self diagnostic mode (step S72), the CPU 10 outputs the access control signal CTRL that indicates the self-diagnosis command (step S73). When the access control signal CTRL that indicates the self-diagnosis command is outputted, the access control circuit 30 performs the self-diagnosis of the RMW circuit 32 (step S74). Then, the determination unit included in the CPU 10 compares the output data after the RMW process with an expected value. When the output data after the RMW process corresponds to the expected value, the determination unit determines that the RMW circuit 32 is normal (step S75: No). When the RMW circuit 32 is determined to be normal, the mode control unit 5 changes to the normal mode (step S76). Thereafter, the CPU 10 of the data processing device executes a predetermined program without performing the self-diagnosis (step S71).

On the other hand, when the output data after the RMW process does not correspond to the expected value, the determination unit determines that an error occurs (step S75: Yes). At this time, the CPU 10 outputs an error signal to the EMU 6 to notify of the error (step S77). The EMU 6 that receives the error signal issues a command to the mode control unit 5 to be an exception handling mode (step S78). Thereby, the mode control unit 5 changes to the exception handling mode (step S79). When the mode control unit 5 changes to the exception handling mode, the CPU 10 outputs the access control signal CTRL that indicates the self-diagnosis command again (step S80). When the access control signal CTRL that indicates the self-diagnosis command is outputted, the access control circuit 30 performs the self-diagnosis of the RMW circuit 32 again (step S81). Then, the determination unit included in the CPU 10 compares the output data after the RMW process with the expected value. When the output data after the RMW process corresponds to the expected value, the determination unit determines that the RMW circuit 32 is normal (step S82: No). When the RMW circuit 32 is determined to be normal, the mode control unit 5 changes to the normal mode (step S76). Thereafter, the CPU 10 of the data processing device executes a predetermined program without performing the self-diagnosis (step S71). In other words, in this case, it is determined that there is an error in a result of the first self-diagnosis.

On the other hand, when the output data after the RMW process does not correspond to the expected value, the determination unit determines that an error occurs (step S82: Yes). At this time, the CPU 10 outputs an error signal to the EMU 6 to notify of the error (step S83). The EMU 6 that receives the error signal again confirms that the RMW circuit 32 of the data processing device fails (step S84). In this case, for example, the EMU 6 stops the operation of the data processing device and notifies a user that the RMW circuit 32 fails by displaying a massage indicating that the RMW circuit 32 fails on a display or the like.

In this way, the data processing device according to the present embodiment switches the diagnostic mode of the data processing device by using the mode control unit 5. Therefore, it is possible to flexibly change the diagnostic mode of the data processing device. The example described above is just an example, and the data processing device according to the present embodiment can arbitrarily switch the diagnostic mode of the data processing device by using the mode control unit 5.

Eighth Embodiment

Next, an eighth embodiment of the present invention will be described. In the eighth embodiment, a case will be described in which the data processing device according to the first to the seventh embodiments described above is applied to an in-car microcontroller.

Figure 25:
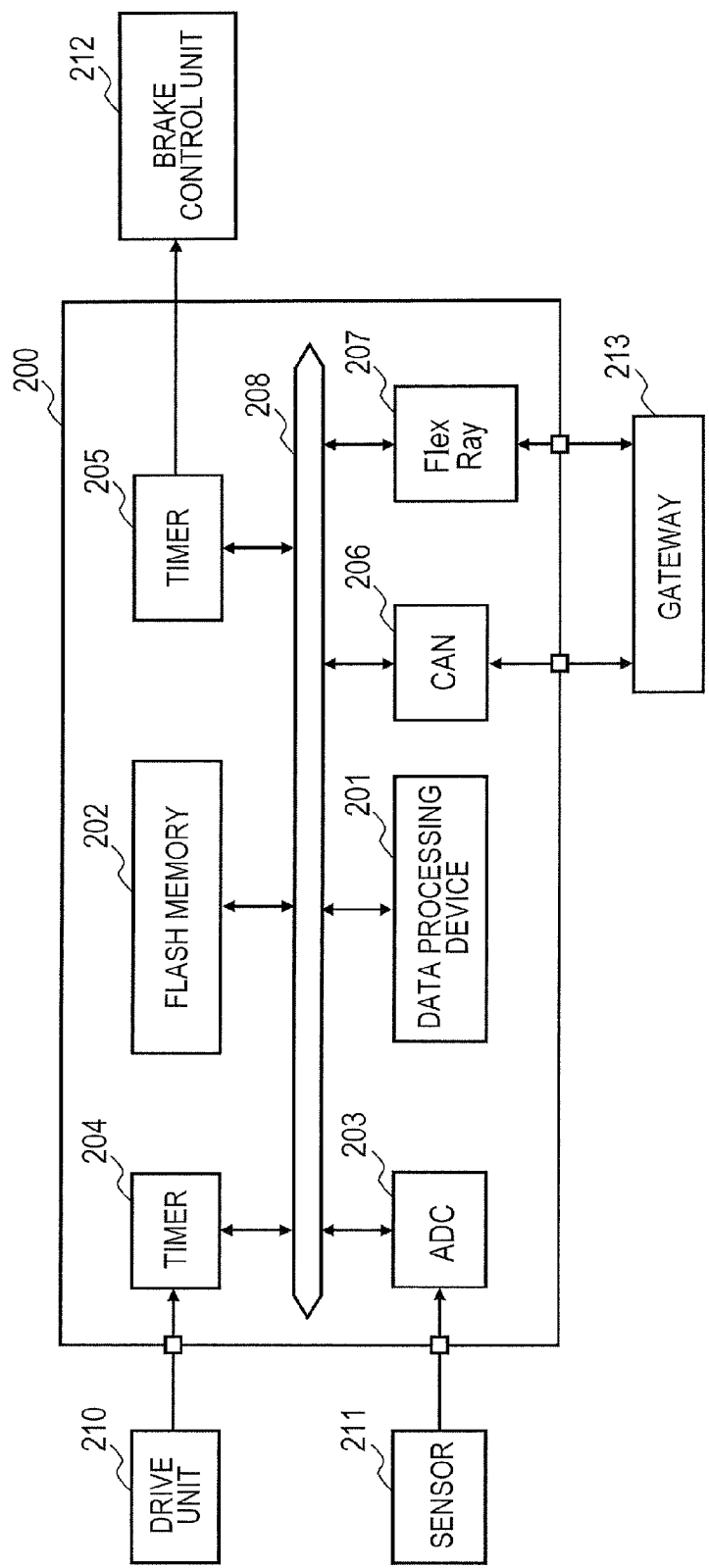
FIG. 25 is a block diagram for explaining an example in which the data processing device according to the present invention is applied to an in-car microcontroller.

FIG. 25 is a block diagram for explaining an example in which the data processing device according to the first to the seventh embodiments is applied to an in-car microcontroller 200. As shown in FIG. 25, the microcontroller 200 includes a data processing device 201, a flash memory 202, an ADC (Analog to Digital Converter) 203, timers 204 and 205, a CAN (Controller Area Network) 206, a FlexRay 207, and a system bus 208.

The data processing device 201 executes a predetermined program. The flash memory 202 stores the program executed by the data processing device 201. The ADC 203 is coupled to a sensor 211 and converts an analog signal transmitted from the sensor into a digital signal. Here, the sensor 211 is, for example, a yaw rate sensor or an acceleration sensor (G sensor). The yaw rate sensor is a sensor that detects a change of rotation angle in a turning direction of a vehicle. The acceleration sensor (G sensor) is a sensor that detects an acceleration of the vehicle in the front-back direction and the left-right direction of the vehicle.

The timer 204 is coupled to a drive unit 210 and detects a speed of the vehicle on the basis of a signal transmitted from the drive unit 210. For example, the timer 204 receives a pulse signal according to a rotation speed of a wheel and measures the number of pulses of the pulse signal within a predetermined time period, so that the timer 204 can detect the speed of the vehicle (rotation speed of the wheel).

The timer 205 outputs a timing signal for controlling a brake to a brake control unit 212. The CAN 206 and the FlexRay 207 are interfaces which couple the microcontroller 200 to a gateway unit 213 provided outside the microcontroller 200 by using CAN and FlexRay which are in-car network standards. The gateway unit 213 is coupled to other in-car microcontrollers.

The data processing device 201, the flash memory 202, the ADC 203, the timers 204 and 205, the CAN 206, and the FlexRay 207 are coupled to each other through the system bus 208.

Next, an operation of the microcontroller according to the present embodiment will be described. The signals outputted from the ADC 203 and the timer 204 are inputted into the data processing device 201, so that the data processing device 201 monitors the yaw rate, the acceleration, and the speed of the vehicle. When the vehicle decelerates by being braked while the vehicle is running, if the rotation of the wheel exceeds a predetermined deceleration, the timer 205 outputs a signal for performing antilock brake system (ABS) control to the brake control unit 212. The brake control unit 212 performs the ABS control of the brake by reducing hydraulic pressure generated by a hydraulic pressure generator (not shown in FIG. 25). By such a control, it is possible to control the brake so that a slip ratio of the wheels approaches a target slip ratio and secure grip force of the tires.

In the present embodiment, a case in which the microcontroller 200 is applied to a brake control system has been described. However, the microcontroller including the data processing device according to the present invention can be used for other than the brake control system.

Although the present invention has been described based on the above embodiments, the present invention is not limited to the above embodiments, and of course, the present invention includes various variations, modifications, and combinations that can be achieved by those skilled in the art without departing from the scope of the inventions defined by the appended claims.

What is claimed is:

1. A test method for a data processing device including a read-modify-write function, the test method comprising the steps of:
   (a) performing the read-modify-write function for first data by the data processing device to generate second data; and
   (b) comparing the second data with expected data by the data processing unit,
   wherein the data processing device invalidates other data processing during a period between the steps (a) and (b).

2. The test method according to claim 1, wherein the data processing device further includes a memory,
   wherein the data processing device invalidates a memory access processing during the period between the steps (a) and (b).

3. The test method according to claim 1, wherein the data processing device further includes a first storage unit that stores the first data.

4. The test method according to claim 1, wherein the data processing device further includes a second storage unit that stores the second data.

5. The test method according to claim 1, wherein the second data is generated by replacing a part of the first data with modification data.

6. The test method according to claim 1, further comprising:
 (c) setting a timing for the steps (a) and (b) by the data processing unit,
 wherein the steps (a) and (b) are executed by the data processing unit at the timing.

7. The test method according to claim 1, wherein the data processing device invalidates said other data processing during the period between the steps (a) and (b) such that a further read-modify-write function is not performed.

8. A test method for a data processing device including a read-modify-e function, the test method comprising the steps of:
 (a) writing self-diagnosis data by the data processing device;
 (b) performing self-diagnosis of the read-modify-function using the self-diagnosis data by the data processing device; and
 (c) reading self-diagnosis output data by the data processing device,
 wherein the data processing device invalidates other data processing at one of the steps (a), (b) and (c).

9. The test method according to claim 8, wherein the data processing device further includes a memory,
 wherein the data processing device invalidates a memory access processing at one of the steps (a), (b) and (c).

10. The test method according to claim 8, further comprising:
 (d) comparing the self-diagnosis output data with expected data by the data processing device.

11. The test method according to claim 8, wherein the self-diagnosis output data is generated by replacing a part of the self-diagnosis data with modification data.

12. The test method according to claim 8, wherein the data processing device further includes a memory,
 wherein the data processing device invalidates a memory access processing at one of the steps (a), (b) and (c).

13. The test method according to claim 8, further comprising:
 (d) setting a timing for the steps (b) and (c) by the data processing unit,
 wherein the steps (b) and (c) are executed by the data processing device at the timing.

14. The test method according to claim 8, wherein the data processing device invalidates said other data processing at one of the steps (a), (b) and (c) such that a further read-modify-write function is not performed.

15. A microcontroller, comprising:
 a first data processing unit;
 a second data processing unit;
 a memory; and
 a read-modify-write unit,
 wherein when the first data processing unit executes a self-diagnosis of the read-modify-write unit, the microcontroller is configured to invalidate an access from the second data processing unit to the memory.

16. The microcontroller according to claim 15, wherein the first data processing unit is a first Central Processing Unit (CPU) and the second data processing unit is a second CPU or a Direct Memory Access Controller (DMAC).

17. The microcontroller according to claim 15, further comprising:
 an Error Correcting Code (ECC) unit,
 wherein the read-modify-write unit is configured to execute a read-modify-write function with the ECC unit.

18. The microcontroller according to claim 15, further comprising:
 a first storage unit that stores first data,
 wherein the read-modify-write unit is configured to generate second data by replacing a part of the first data with modification data when the self-diagnosis is executed.

19. The microcontroller according to claim 18, further comprising:
 a second storage unit that sores the second data.

20. The microcontroller according to claim 15, wherein when the first data processing unit executes the self-diagnosis of the read-modify-write unit, the microcontroller is configured to invalidate the access from the second data processing unit to the memory such that a further read-modify-write function is not performed.

* * * * *